United States Patent
Janjua et al.

(10) Patent No.: US 11,636,901 B2
(45) Date of Patent: *Apr. 25, 2023

(54) MEMORY DEVICE

(71) Applicant: SAMSUNG ELECTRONICS CO., LTD., Suwon-si (KR)

(72) Inventors: Bilal Ahmad Janjua, Suwon-si (KR); Sung Whan Seo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/403,316

(22) Filed: Aug. 16, 2021

(65) Prior Publication Data

US 2021/0375373 A1 Dec. 2, 2021

Related U.S. Application Data

(63) Continuation of application No. 16/944,311, filed on Jul. 31, 2020, now Pat. No. 11,127,474.

(30) Foreign Application Priority Data

Dec. 31, 2019 (KR) .................. 10-2019-0179332

(51) Int. Cl.
| | |
|---|---|
| *G11C 16/30* | (2006.01) |
| *G11C 16/04* | (2006.01) |
| *H01L 25/065* | (2023.01) |
| *H01L 23/00* | (2006.01) |
| *H01L 25/18* | (2023.01) |
| *G11C 5/14* | (2006.01) |

(52) U.S. Cl.
CPC .......... *G11C 16/30* (2013.01); *G11C 16/0483* (2013.01); *H01L 24/08* (2013.01); *H01L 25/0657* (2013.01); *H01L 25/18* (2013.01); *G11C 5/145* (2013.01); *G11C 5/146* (2013.01); *H01L 2224/08145* (2013.01); *H01L 2924/1431* (2013.01); *H01L 2924/14511* (2013.01)

(58) Field of Classification Search
None
See application file for complete search history.

(56) References Cited

U.S. PATENT DOCUMENTS

| | | |
|---|---|---|
| 5,581,454 A | 12/1996 | Collins |
| 5,999,040 A | 12/1999 | Do et al. |
| 6,198,645 B1 | 3/2001 | Kotowski et al. |

(Continued)

OTHER PUBLICATIONS

Notice of Allowance corresponding to U.S. Appl. No. 16/944,311 dated May 28, 2021.

*Primary Examiner* — Tan T. Nguyen
(74) *Attorney, Agent, or Firm* — Sughrue Mion, PLLC

(57) ABSTRACT

A memory device includes a charge pump connected to a power supply voltage and including a plurality of stages to output an output voltage, a stage counter configured to output a count value that incrementally increases to a number of the stages, and a regulator configured to compare the output voltage with a reference output voltage of the charge pump that is generated using the incrementally increasing count value obtained by the stage counter, and to output a pump operation signal at a time when the reference output voltage becomes greater than or equal to the output voltage, wherein the charge pump operates in response to the pump operation signal.

20 Claims, 20 Drawing Sheets

(56) References Cited

U.S. PATENT DOCUMENTS

| | | | |
|---|---|---|---|
| 6,486,728 B2 | 11/2002 | Kleveland | |
| 6,760,262 B2 | 7/2004 | Haeberli et al. | |
| 7,548,466 B2 * | 6/2009 | Park | G11C 8/08 |
| | | | 365/189.09 |
| 8,022,752 B2 | 9/2011 | Pelgrom et al. | |
| 9,007,046 B2 | 4/2015 | Pan | |
| 9,077,238 B2 | 7/2015 | Pan et al. | |
| 11,127,474 B2 * | 9/2021 | Janjua | H01L 27/11582 |
| 2010/0246305 A1 * | 9/2010 | Yang | G11C 11/4074 |
| | | | 327/536 |
| 2013/0148456 A1 * | 6/2013 | Cho | G11C 5/145 |
| | | | 365/226 |
| 2019/0378857 A1 * | 12/2019 | Lee | H01L 27/11521 |
| 2020/0098786 A1 * | 3/2020 | Park | H01L 23/481 |
| 2020/0381058 A1 * | 12/2020 | Lee | G11C 11/5671 |
| 2021/0065751 A1 * | 3/2021 | Park | H01L 25/18 |
| 2021/0143160 A1 * | 5/2021 | Ryu | H01L 27/11582 |

\* cited by examiner

MEMORY DEVICE

CROSS-REFERENCE TO RELATED APPLICATION

This application is a continuation of U.S. patent application Ser. No. 16/944,311, filed on Jul. 31, 2020, which is based on and claims priority under 35 U.S.C. § 119 to Korean Patent Application No. 10-2019-0179332, filed on Dec. 31, 2019, in the Korean Intellectual Property Office, the disclosure of which is herein incorporated by reference herein in its entirety.

BACKGROUND

1. Field

The disclosure relates to a memory device.

2. Description of the Related Art

The memory device is a storage device capable of storing data and reading it when necessary. Memory devices can be broadly classified into a non-volatile memory (NVM) in which stored data is retained even when power is not supplied, and a volatile memory (VM) in which stored data is deleted when power is not supplied. The non-volatile memory device retains stored data even when power supply is switched off. The non-volatile memory devices include a read-only memory (ROM), a programmable ROM (PROM), an erasable PROM (EPROM), an electrically erasable PROM (EEPROM), a flash memory, a phase-change random-access memory (PRAM), a magnetoresistive RAM (MRAM), a resistive RAM (RRAM), a ferroelectric RAM (FRAM), and the like. The flash memory can be roughly divided into a NOR type memory and a NAND type memory.

SUMMARY

Aspects of the disclosure provide a memory device capable of improving operation performance by reducing a time taken to generate an output voltage for memory cells.

Aspects of the disclosure also provide a memory device capable of reducing energy consumption by reducing a time taken to generate an output voltage for memory cells.

In accordance with an aspect of the disclosure, a memory device includes a charge pump connected to a power supply voltage, the charge pump including a plurality of stages to output an output voltage; a stage counter configured to output a count value that incrementally increases to a number of the plurality of stages; and a regulator configured to compare the output voltage with a reference output voltage of the charge pump, the reference output voltage being generated using the incrementally increasing count value obtained by the stage counter, and to output a pump operation signal at a time when the reference output voltage becomes greater than or equal to the output voltage, wherein the charge pump is configured to operate in response to the pump operation signal.

The charge pump may be configured to output the output voltage equal to the reference output voltage when the pump operation signal is output.

The stage counter may include a delay circuit configured to output a stage reference signal having a number of bits corresponding to the number of the plurality of stages, and wherein the count value is obtained according to a number of bits included in the stage reference signal having a first logic level.

The regulator may be configured to generate a stage operation signal based on the stage reference signal and the pump operation signal, and wherein each stage from among the plurality of stages of the charge pump is configured to operate in response to the stage operation signal.

The memory device may further include a plurality of switches respectively connecting the power supply voltage to the plurality of stages, wherein the plurality of switches is configured to operate in accordance with the stage operation signal.

The regulator may be configured to generate a pump clock signal based on a clock signal and the pump operation signal, and wherein the charge pump is configured to generate a stage clock signal based on the pump clock signal and the stage operation signal to enable the plurality of stages of the charge pump.

The charge pump may be configured to operate from a stage corresponding to the obtained count value at the time when the reference output voltage becomes greater than or equal to the output voltage, and wherein the output voltage of the charge pump is set to equal the reference output voltage from the time when the reference output voltage becomes greater than or equal to the output voltage.

The regulator may be configured to output the pump operation signal by comparing the output voltage with the reference output voltage while the output voltage of the charge pump decreases to a ground voltage.

In accordance with an aspect of the disclosure, a memory device includes a charge pump connected to a power supply voltage, the charge pump including a plurality of stages; a stage counter configured to output a respective stage reference signal corresponding to each stage from among the plurality of stages; and a regulator configured to generate a stage operation signal different from the stage reference signal based on the stage reference signal and a first stage control signal, wherein the regulator is configured to output the stage operation signal when the first stage control signal is at a first logic level, wherein the regulator is configured to output the stage reference signal when the first stage control signal is at a second logic level, and wherein the charge pump is configured to generate an output voltage using a number of stages corresponding to the stage reference signal or the stage operation signal output by the regulator.

The regulator may include a detector configured to set a pump operation signal to the first logic level when the output voltage of the charge pump is equal to or greater than a reference output voltage of the charge pump, the reference output voltage being generated using the number of stages, and wherein the charge pump is configured to generate the output voltage in response to the pump operation signal.

The stage operation signal may be equal to the stage reference signal from a time point at which the pump operation signal is output.

The detector may be configured to compare a reference voltage with a feedback voltage of a feedback node, the feedback voltage being based on the output voltage and a stage resistance of a stage resistor connected to the feedback node, to output the pump operation signal, wherein the stage resistance is determined based on the stage reference signal.

The stage counter may include a first sub-circuit configured to generate a delay signal based on a pump system control signal and an inverted pump system control signal; a second sub-circuit configured to generate a delay enable signal based on the pump system control signal and a second stage control signal; and a delay circuit configured to receive the delay signal and the delay enable signal and generate the stage reference signal based on the delay signal and the delay enable signal.

The first stage control signal may be output at a same time point as the second stage control signal.

The pump system control signal and the second stage control signal may be output at a same time point.

The regulator may include a first circuit configured to output a pump operation signal; a second circuit configured to generate a delay operation signal based on the pump operation signal; and a third circuit configured to generate a stage enable signal by performing a NAND operation and an inversion operation on the first stage control signal and a signal obtained based on the delay signal and the delay operation signal, wherein the charge pump is configured to generate the output voltage in response to the pump operation signal, and wherein the regulator is configured to output the stage operation signal based on the stage enable signal and the stage reference signal.

In accordance with an aspect of the disclosure, a memory device includes a memory cell array comprising a plurality of memory cells; and a voltage generator configured to generate a program voltage of a memory cell in the memory cell array using a power supply voltage, wherein the voltage generator includes a charge pump including a plurality of stages, the charge pump being configured to generate the program voltage using the power supply voltage, and a regulator configured to control an operation time point of the charge pump by comparing a reference output voltage of the charge pump, generated using at least one of the plurality of stages, with an output voltage of the charge pump as it recovers from the program voltage to a ground voltage after the charge pump generates the program voltage.

The memory device may further include a control logic configured to output a control signal for enabling a verify operation for the memory cell in a recovery operation after the voltage generator generates the program voltage of the memory cell.

The voltage generator may be configured to control the operation time point of the charge pump in response to the control signal.

The regulator may be configured to output a stage operation signal for enabling an operation of the charge pump when the output voltage of the charge pump is greater than or equal to the reference output voltage of the charge pump.

BRIEF DESCRIPTION OF THE DRAWINGS

The above and other aspects of the disclosure will become more apparent by describing in detail embodiments thereof with reference to the attached drawings, in which.

DETAILED DESCRIPTION

Figure 1:
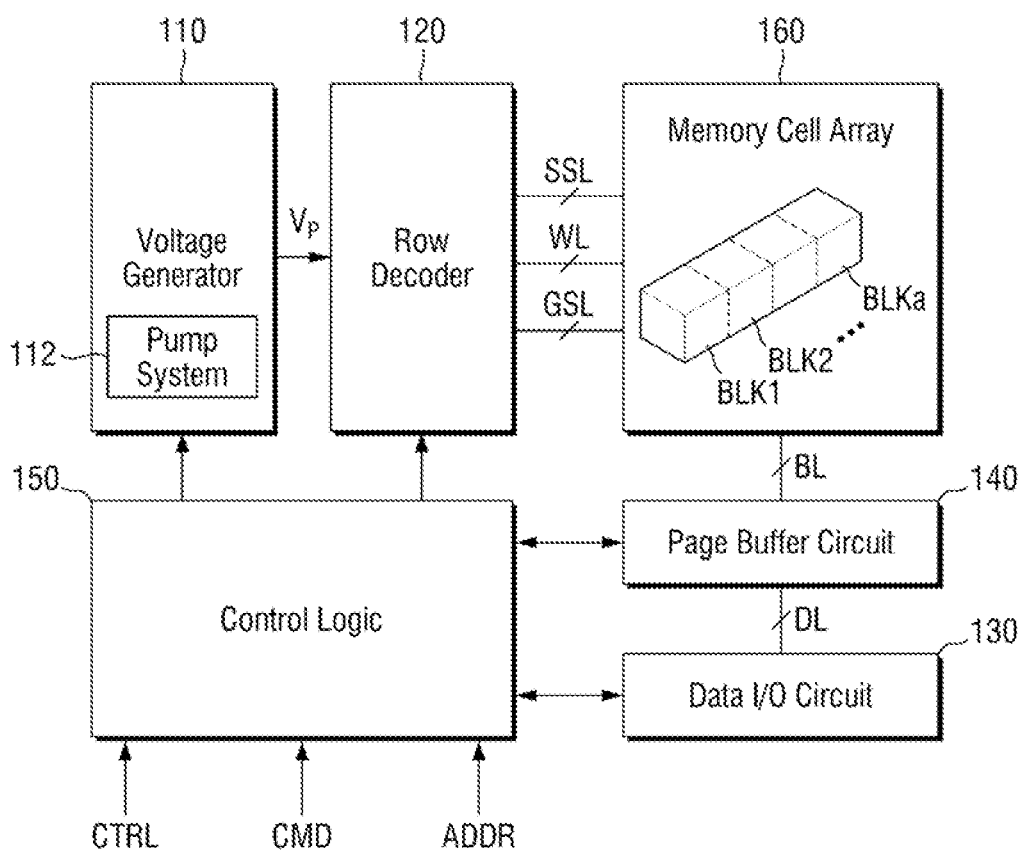
FIG. 1 is a diagram illustrating a memory device according to an embodiment.

FIG. 1 is a diagram illustrating a memory device according to an embodiment.

Referring to FIG. 1, a memory device according to an embodiment may include a voltage generator 110, a row decoder 120, a data input/output circuit 130, a page buffer circuit 140, a control logic 150, and a memory cell array 160.

The memory device may include, e.g., a NAND flash memory, a vertical NAND (VNAND) flash memory, a NOR flash memory, a resistive random access memory (RRAM), a phase change RAM (PRAM), a magnetic RAM (MRAM), a ferroelectric RAM (FRAM), a spin transfer torque RAM (STT-RAM) and the like, but the disclosure is not limited thereto.

Hereinafter, the disclosure will be described with reference to an example that the memory device is a VNAND flash memory, but the scope of the disclosure is not limited thereto. That is, embodiments according to the disclosure can be applied to any of the non-volatile memories described above.

The voltage generator 110 may include a pump system 112. The voltage generator 110 may generate an operation voltage (output voltage) $V_P$ required to operate the memory device by using the pump system 112 supplied with a power supply voltage VCC. The operation voltage $V_P$ may include, e.g., a program voltage, a pass voltage, a read voltage, a read pass voltage, a verify voltage, an erase voltage, a bit line voltage, a common source line voltage or the like, but the disclosure is not limited thereto.

The pump system 112 may generate a word-line voltage required to program new data to a memory cell arranged in the memory cell array 160, read or erase data stored in a memory cell arranged in the memory cell array 160. This will be described later with reference to FIG. 4.

The row decoder 120 may select one among memory blocks BLK1 to BLKa in response to an address ADDR provided to the control logic 150. Further, the row decoder 120 may be connected to the memory cell array 160 through a plurality of word lines WL, at least one string selection line SSL, and at least one ground selection line GSL.

The row decoder 120 may select a word line WL, a string selection line SSL, and a ground selection line GSL by using a decoded row address. Further, the row decoder 120 may decode a column address within the input address. The decoded column address may be transmitted to the data input/output circuit 130.

The data input/output circuit 130 may be connected to the control logic 150 through a bit line BL. The data input/output circuit 130 may perform an operation such as input, output or the like according to an operation signal transmitted from the control logic 150. The data input/output circuit 130 may provide the address ADDR, a command CMD, or a control signal CTRL, which may be input from a memory controller, to the control logic 150.

The page buffer circuit 140 may receive an operation signal from the control logic 150. The page buffer circuit 140 may perform an operation such as erase, verify, or program according to the operation signal from the control logic 150.

The page buffer circuit 140 may be connected to the memory cell array 160 through bit lines BL. The page buffer circuit 140 may apply an identical voltage to bit lines BL during an erase operation. In a verify operation, the page buffer circuit 140 may apply a read voltage to a specific bit line BL to detect an erase result with respect to a specific memory cell. In a program operation, the page buffer circuit 140 may apply a program voltage or an inhibit voltage to a specific bit line BL to program memory cells connected to the bit line BL to which the program voltage is applied.

The control logic 150 may generate an operation signal such as erase, verify, program or the like according to the command CMD or the control signal CTRL transmitted from the memory controller. The control logic 150 may provide the generated operation signal to the voltage generator 110, the row decoder 120, the data input/output circuit 130 or the page buffer circuit 140. When necessary, the memory device may include more components in addition to the above-described components.

Figure 3:
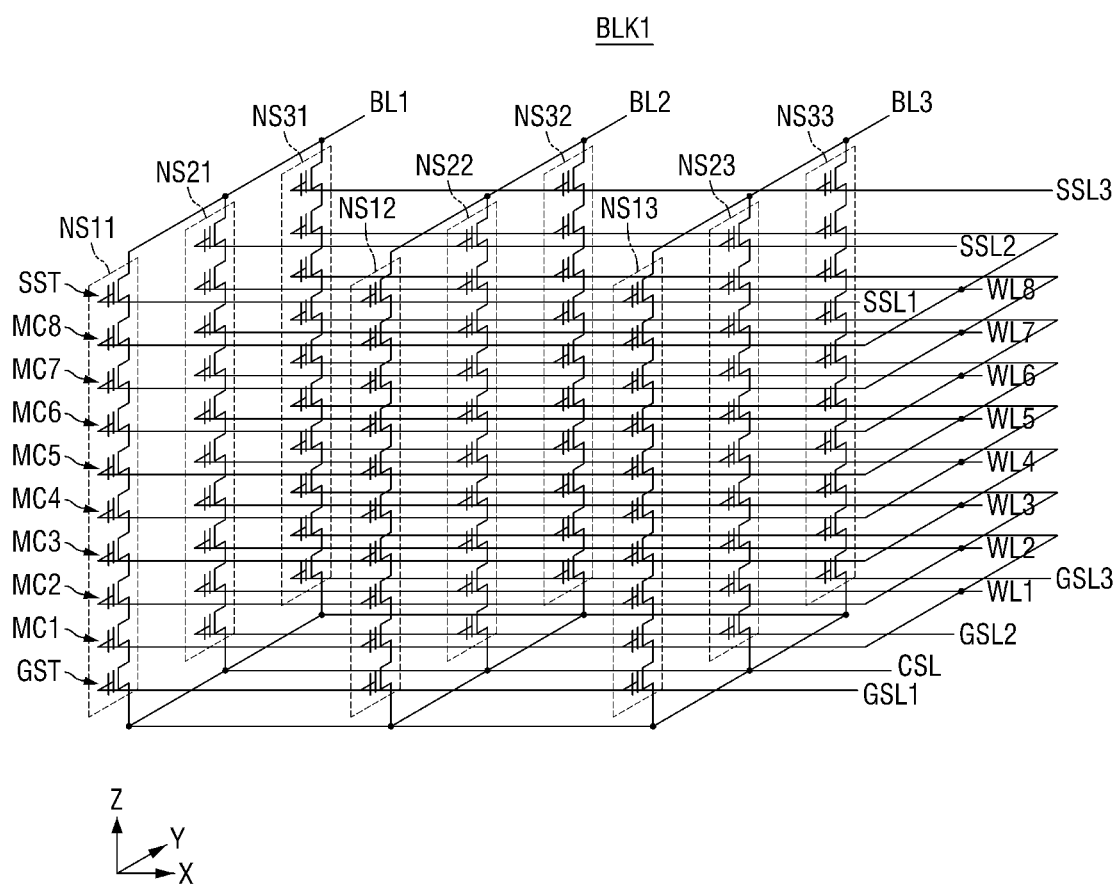
FIG. 3 is a circuit diagram illustrating a memory block of FIG. 2.

The memory cell array 160 may include the plurality of memory blocks BLK1 to BLKa. Each of the memory blocks BLK1 to BLKa may be connected to the row decoder 120 through the plurality of word lines WL, at least one string selection line SSL, at least one ground selection line GSL, and a common source line CSL as shown in FIG. 3. Further, each of the memory blocks BLK1 to BLKa may be connected to the page buffer circuit 140 through the plurality of bit lines BL.

Figure 2:
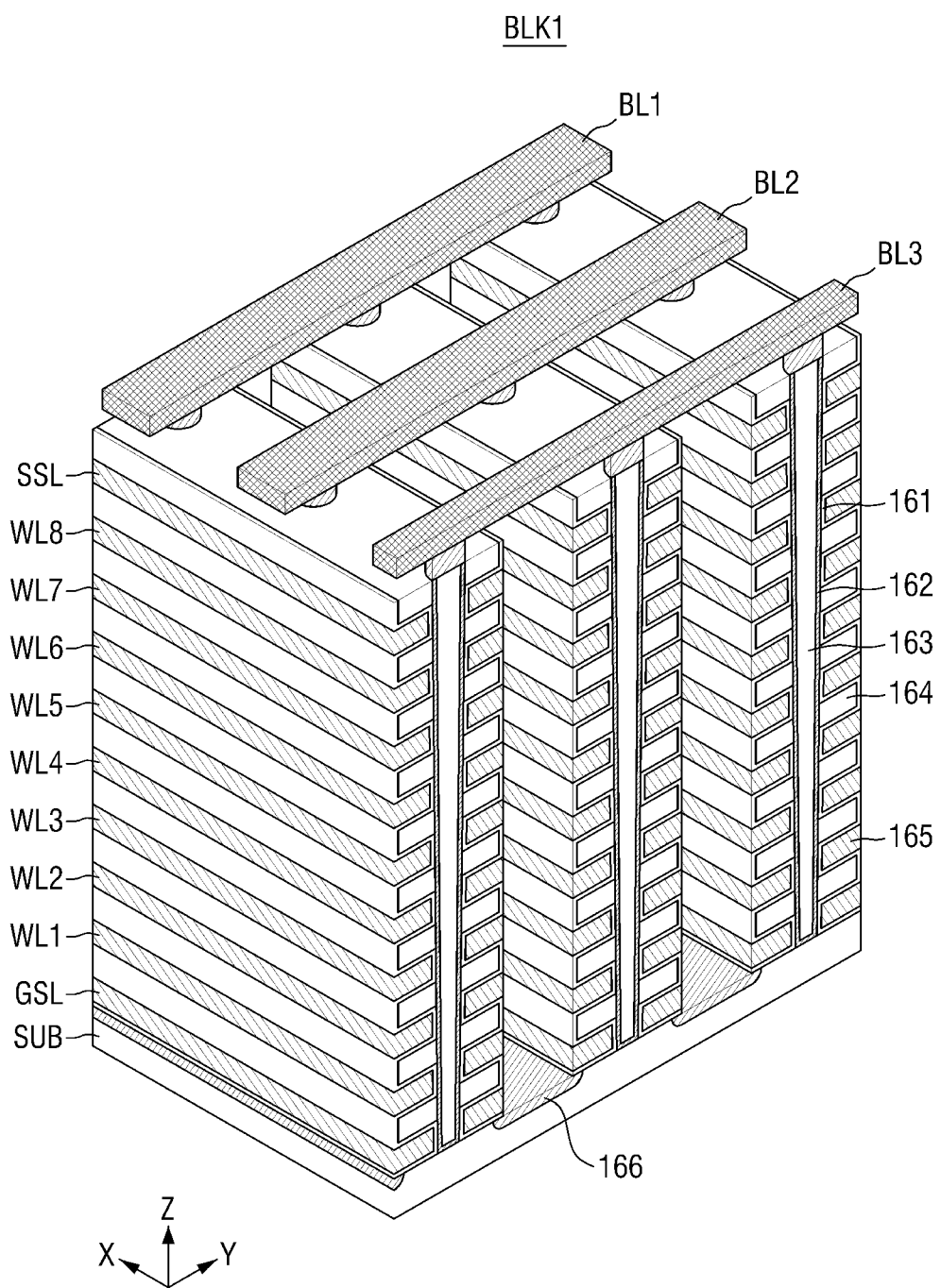
FIG. 2 is a diagram illustrating a memory block of a memory cell array of memory devices of FIG. 1.

FIG. 2 is a diagram illustrating a memory block of a memory cell array of FIG. 1.

Referring to FIG. 2, the memory block BLK1 may include a substrate SUB extending in a first direction (X direction) and a second direction (Y direction), the ground selection line GSL, a plurality of word lines WL1 to WL8, the string selection line SSL, and a plurality of bit lines BL1 to BL3. The memory block BLK1 may be formed in a direction perpendicular to the substrate SUB. The ground selection line GSL, the word lines WL1 to WL8, and the string selection line SSL may be sequentially stacked on the substrate SUB in a third direction (Z direction).

The substrate SUB may be of a first conductivity type (e.g., p-type), and formed with the common source line CSL doped with impurities of a second conductivity type (e.g., n-type). An insulating layer 164 and a gate electrode 165 may be alternately stacked above the substrate SUB. A data storage layer 161 may be formed between the insulating layer 164 and the gate electrode 165.

A pillar may penetrate the insulating layer 164 and the gate electrode 165 in a vertical direction (e.g., the Z direction). The pillar may be connected to the substrate SUB through the insulating layer 164 and the gate electrode 165. The interior of the pillar may be formed with a dielectric-filled pattern 163 including an insulating material such as silicon oxide. A vertical active pattern 162 may be provided outside of the pillar to include a channel semiconductor, and to be used as a channel.

The gate electrode 165 of the memory block BLK1 may be connected to the ground selection line GSL, the word lines WL1 to WL8, and the string selection line SSL. The vertical active pattern 162 formed outside the pillar of the memory block BLK1 to be used as a channel may be connected to the bit lines BL1 to BL3.

In FIG. 2, one memory block BLK1 is illustrated to have eight word lines WL1 to WL8 and three bit lines BL1 to BL3, but the disclosure is not limited thereto. When necessary, the number of wirings may be variously modified.

FIG. 3 is a circuit diagram illustrating a memory block of FIG. 2.

Referring to FIG. 3, the memory block BLK1 includes a plurality of cell strings NS11 to NS33 arranged in the first direction (X direction) and the second direction (Y direction). Each of the cell strings NS11 to NS33 may include a ground selection transistor GST, a plurality of memory cells MC1 to MC8, and a string selection transistor SST.

The string selection transistor SST may be connected to the string selection line SSL. As shown in FIG. 3, the string selection line SSL may be divided into first to third string selection lines SSL1 to SSL3. The ground selection transistor GST may be connected to ground selection lines GSL1 to GSL3. In some embodiments, the ground selection lines GSL1 to GSL3 may be connected to each other. The string selection transistor SST may be connected to the bit line BL, and the ground selection transistor GST may be connected to the common source line CSL.

The memory cells MC1 to MC8 may be connected to the corresponding word lines WL1 to WL8, respectively. A set of memory cells connected to one word line to be simultaneously programmed can be called a page. The memory block BLK1 may include a plurality of pages as shown in FIG. 3. Further, a plurality of pages may be connected to one word line. A word line (e.g., the word line WL4) may be commonly connected to three pages at the same height from the common source line CSL. For example, the world line WL4 shown in FIG. 3 may be connected to the respective memory cell MC4 in each of the cell strings NS11 to NS33.

Each page may be a unit of data program and data read, and the memory block BLK1 may be a unit of data erase. That is, when the memory device performs a program or read operation, data of a page unit may be programmed or read, and when the memory device performs an erase operation, data of a memory block unit may be erased. That is, data stored in all the memory cells MC1 to MC8 included in one memory block may be erased at once.

Further, each of the memory cells MC1 to MC8 may store one bit of data or two or more bits of data. The memory cells MC1 to MC8 may be, e.g., a single level cell (SLC) or a single bit cell (SBC) capable of storing one bit of data in one memory cell. The memory cells MC1 to MC8 may be, e.g., a multi-level cell (MLC) or multi-bit cell (MBC) capable of storing two or more bits of data in one memory cell. Alternatively, some memory cells may be single level cells, and some other memory cells may be multi-level cells. In the case of two-bit MLC, two page data may be stored in one physical page. Therefore, six page data may be stored in the memory cells MC4 connected to the word line WL4 because the word line WL4 is connected to three physical pages. In some embodiments, each of the memory cells MC1 to MC8 may store three bits or more data. In this case, three or more page data may be stored in one physical page.

Figure 4:
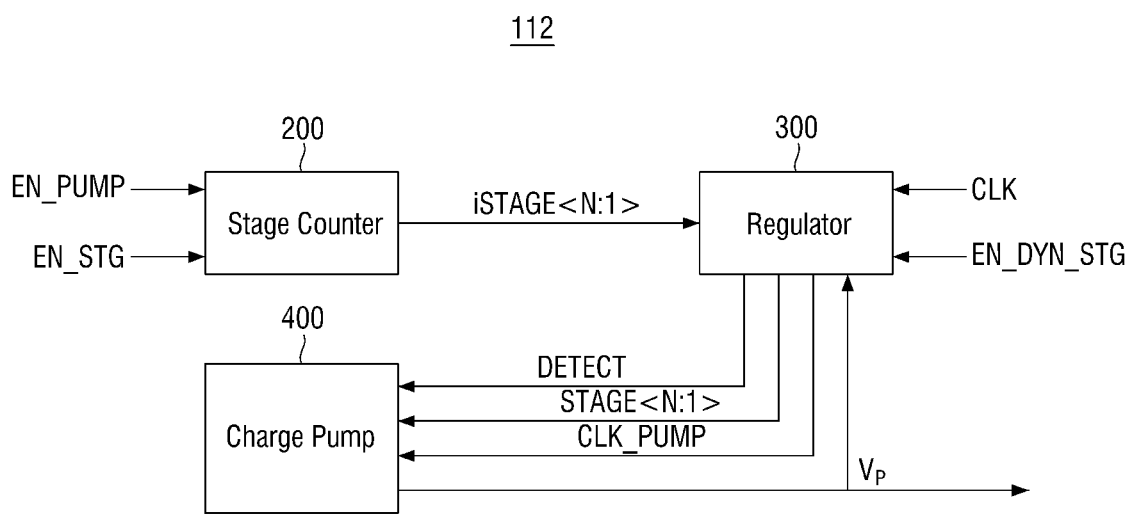
FIG. 4 is a diagram explaining a pump system of FIG. 1.

FIG. 4 is a diagram explaining a pump system of FIG. 1.

Referring to FIG. 4, the pump system 112 may include a stage counter 200, a regulator 300, and a charge pump 400. The pump system 112 may receive a pump system control signal EN_PUMP, a first stage control signal EN_DYN_STG, a second stage control signal EN_STG, and a clock signal CLK to generate and output the output voltage $V_P$ by using the power supply voltage VCC. A description of the pump system 112 follows with reference to FIGS. 5 to 10.

Figure 5:
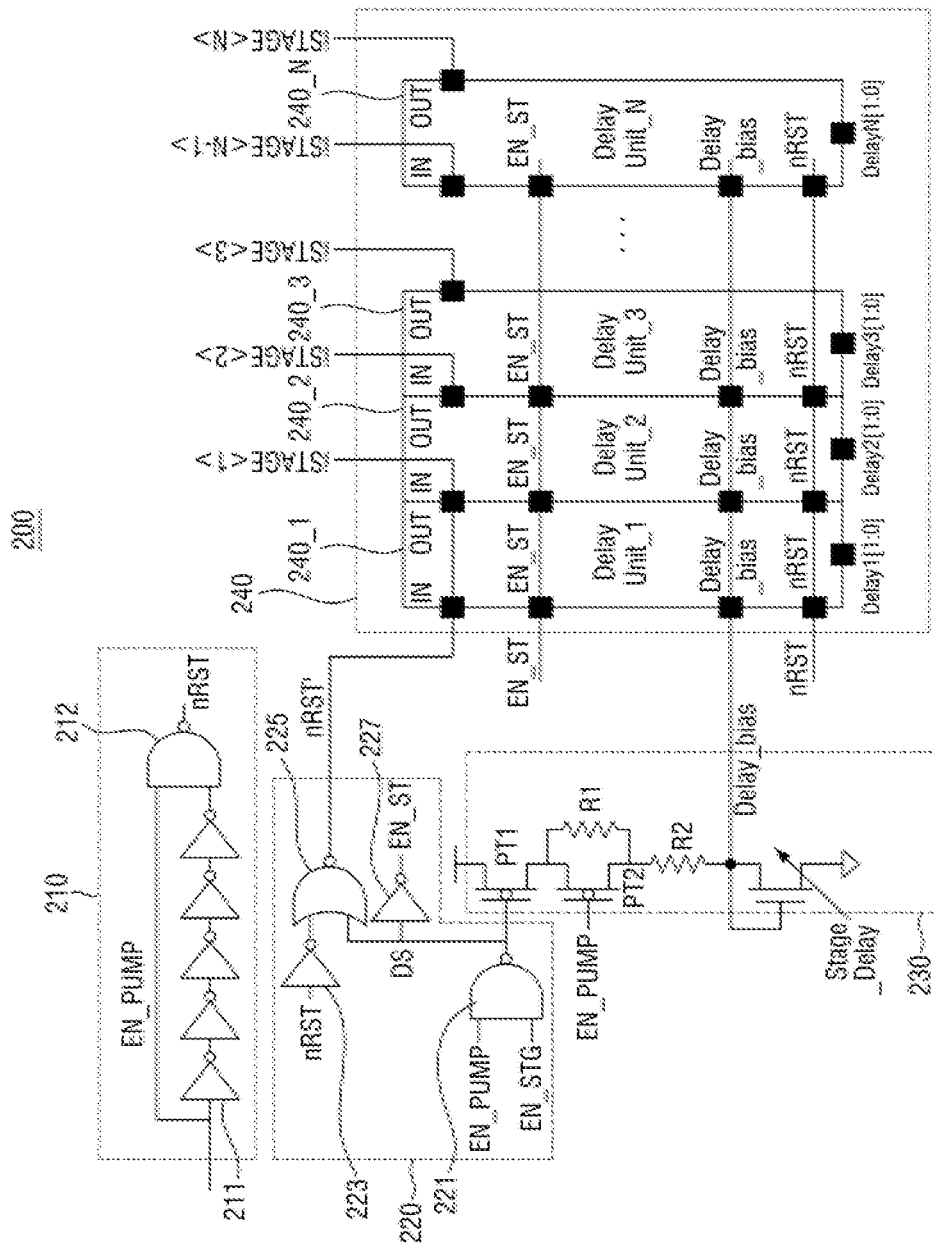
FIG. 5 is a diagram illustrating a stage counter of FIG. 4.

FIG. 5 is a diagram illustrating the stage counter 200 of FIG. 4.

Referring to FIGS. 4 and 5, the stage counter 200 may receive the pump system control signal EN_PUMP and the second stage control signal EN_STG to output a stage reference signal iSTAGE<N:1> of N bits. The stage counter 200 may include a first sub-circuit 210, a second sub-circuit 220, a third sub-circuit 230, and a delay circuit 240. Here, the stage reference signal iSTAGE<M> may be a signal of an $M^{th}$ bit of the signal iSTAGE<N:1> of N bits.

The first sub-circuit 210 may receive the pump system control signal EN_PUMP to generate a delay signal nRST. The first sub-circuit 210 may include a NAND gate 212 and a plurality of inverters 211 connected in series. The stage counter 200 may include an odd number of inverters 211. The odd number of inverters 211 may be connected such that an output of one inverter is provided as an input of another inverter. The number of the inverters 211 may be five, for example, but the disclosure is not limited thereto. The pump system control signal EN_PUMP may be input to the inverters 211 and the NAND gate 212. The NAND gate 212 may perform the NAND operation on the pump system control signal EN_PUMP and the output signal of the inverters 211 to generate the delay signal nRST.

The second sub-circuit 220 may receive the delay signal nRST generated by the first sub-circuit 210, the pump system control signal EN_PUMP, and the second stage control signal EN_STG to generate an intermediate signal nRST' and a delay enable signal EN_ST. The second sub-circuit 220 may include a NAND gate 221, inverters 223 and 227, and a NOR gate 225.

The NAND gate 221 may perform the NAND operation on the pump system control signal EN_PUMP and the second stage control signal EN_STG to generate a delay sub-signal DS. The inverter 223 may invert the delay signal nRST to output an inverted signal of the delay signal nRST. The NOR gate 225 may perform the NOR operation on the inverted signal and the delay sub-signal DS to generate the intermediate signal nRST'. The intermediate signal nRST' may be input to the delay circuit 240. Further, the inverter 227 may invert the delay sub-signal DS to generate a delay enable signal EN_ST. The delay enable signal EN_ST may be input to the delay circuit 240.

The third sub-circuit 230 may receive the pump system control signal EN_PUMP and the delay sub-signal DS to output a delay bias Delay_bias. The third sub-circuit 230 may include a first transistor PT1 and a second transistor PT2. The first transistor PT1 is gated by the delay sub-signal DS. The second transistor PT2 is gated by the pump system control signal EN_PUMP and may be connected to a first resistor R1 in parallel. One end of the second transistor PT2 is connected to the first transistor PT1, and the other end of the second transistor PT2 is connected to a second resistor R2. The delay bias Delay_bias may be generated by the first transistor PT1, the second transistor PT2, the first resistor R1, and the second resistor R2. The delay bias Delay_bias may be input to the delay circuit 240.

The delay circuit 240 may include a plurality of delay units 240_1 to 240_N. The first delay unit 240_1 may receive the intermediate signal nRST', the delay enable signal EN_ST, the delay bias Delay_bias, the delay signal nRST, and a first delay signal Delay1[1:0]. The first delay unit 240_1 may output the first stage reference signal iSTAGE<1>. The second delay unit 240_2 may receive the first stage reference signal iSTAGE<1>, the delay enable signal EN_ST, the delay bias Delay_bias, the delay signal nRST, and a second delay signal Delay2[1:0]. The second delay unit 240_2 may output the second stage reference signal iSTAGE<2>. Since the inputs and the output of each of the third delay unit 240_3 to the Nth delay unit 240_N are the same as those of the second delay unit 240_2, a description thereof is omitted.

Therefore, the stage counter 200 may output the stage reference signal iSTAGE<N:1>. The stage reference signal iSTAGE<N:1> may incrementally increase in accordance with output of the delay signal nRST, the intermediate signal nRST', the delay enable signal EN_ST, and the delay bias Delay_bias. Hereinafter, the delay units 240_1 to 240_N will be described with reference to FIG. 6.

Figure 6:
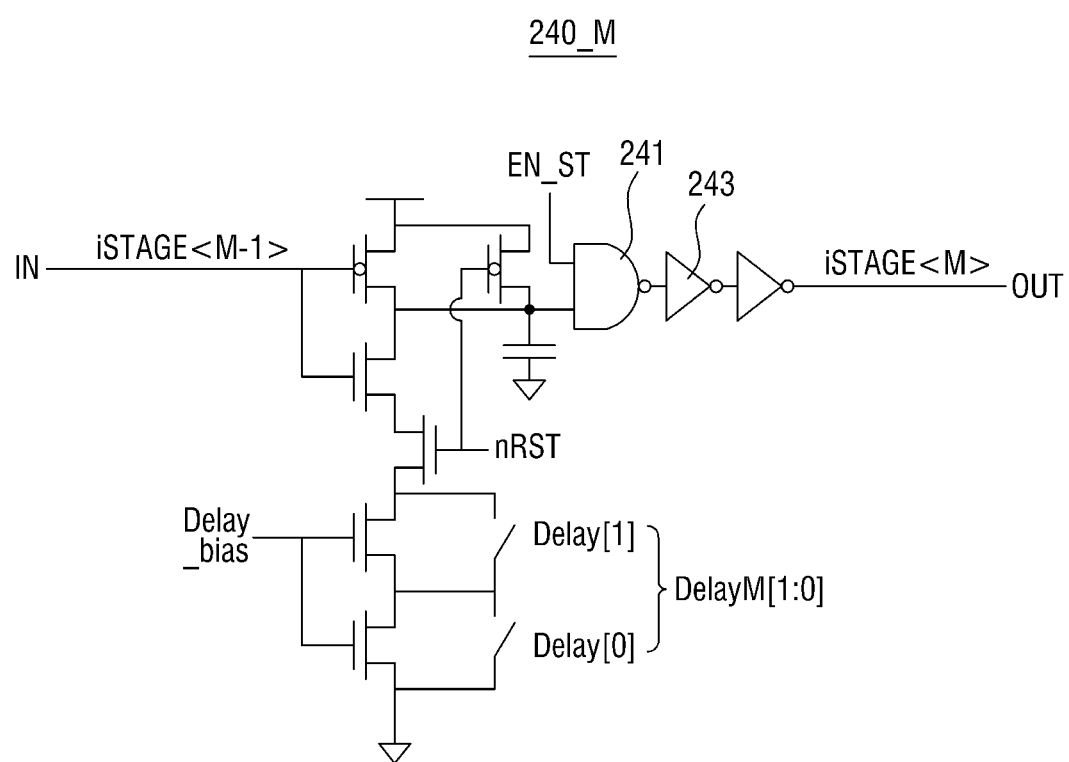
FIG. 6 is a diagram illustrating a delay unit of FIG. 5.

FIG. 6 is a diagram illustrating the delay unit of FIG. 5.

Referring to FIG. 6, the $M^{th}$ delay unit 240_M (M is a natural number equal to or greater than 1 and less than or equal to N) may receive an $(M-1)^{th}$ stage reference signal iSTAGE<M-1> at an input terminal IN, and may output the $M^{th}$ stage reference signal iSTAGE<M> at an output terminal OUT.

The $M^{th}$ delay unit 240_M may include a transistor gated by the $(M-1)^{th}$ stage reference signal iSTAGE<M-1>, a transistor gated by the delay signal nRST, and a transistor gated by the delay bias Delay_bias. The $M^{th}$ delay unit 240_M may further include switches switched by the delay signal DelayM[1:0], a NAND gate 241, and an even number of inverters 243. The number of the inverters 243 may be two, for example, but the disclosure is not limited thereto.

The NAND gate 241 may perform the NAND operation on the delay enable signal EN_ST and a signal generated by the transistors and the switches. The even number of inverters 243 may be provided in series to output the $M^{th}$ stage reference signal iSTAGE<M> by inverting a signal generated by the NAND operation as shown in FIG. 6. The $M^{th}$ stage reference signal iSTAGE<M> may be input to the $(M+1)^{th}$ delay unit 240_M+1.

Figure 7:
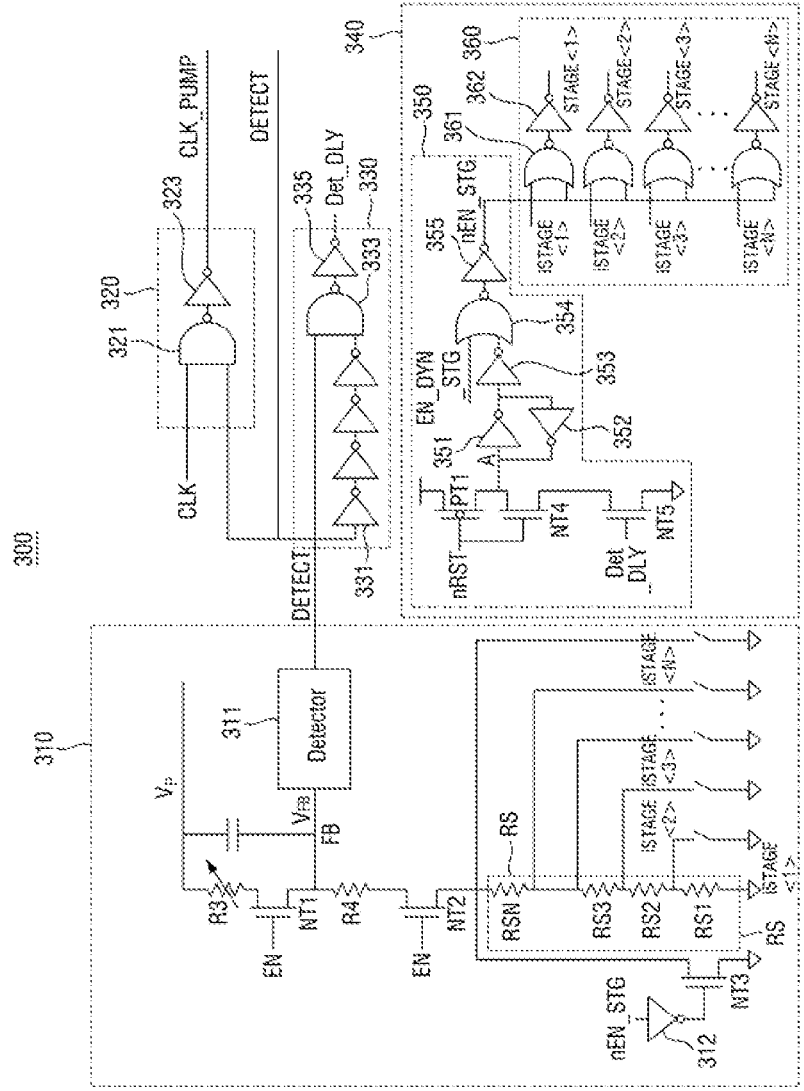
FIG. 7 is a diagram illustrating a regulator of FIG. 4.

FIG. 7 is a diagram illustrating the regulator of FIG. 4.

Referring to FIG. 7, the regulator 300 may receive the stage reference signal iSTAGE<N:1>, the clock signal CLK, the first stage control signal EN_DYN_STG, and the output voltage $V_P$. The regulator 300 may output a pump clock signal CLK_PUMP, a pump operation signal DETECT, and a stage operation signal STAGE<N:1>. The regulator 300 may include a first circuit 310, a second circuit 320, a third circuit 330, and a fourth circuit 340. Here, the stage operation signal STAGE<M> may be a signal of the $M^{th}$ bit of the stage operation signal STAGE<N:1> of N bits.

The first circuit 310 may receive an enable signal EN, the output voltage $V_P$, and a stage enable signal nEN_STG generated by the fourth circuit 340 to output the pump operation signal DETECT.

The first circuit 310 includes first to third transistors NT1 to NT3 and a detector 311. The first and second transistors NT1 and NT2 are gated by the enable signal EN and the third transistor NT3 is gated by a signal generated by inverting the stage enable signal nEN_STG using an inverter 312.

One end of the first transistor NT1 may be connected to a third resistor R3 connected to the output voltage $V_P$ and the other end thereof may be connected to a feedback node FB. One end of the second transistor NT2 may be connected to a fourth resistor R4 connected to the feedback node FB, and the other end thereof may be connected to a plurality of stage resistors RS (i.e., a stage resistor) connected in series. One end of the third transistor NT3 may be connected to the stage resistors RS, and the other end thereof may be grounded.

The stage resistance RS may be determined by a switch operated according to the stage reference signal iSTAGE<N> of N bits. That is, the stage resistance RS may be determined by the stage reference signal iSTAGE<N>.

Meanwhile, the detector 311 may output the pump operation signal DETECT by using a voltage $V_{FB}$ (i.e., a feedback voltage) of the feedback node. The voltage $V_{FB}$ of the feedback node may be as shown in Eq. 1 below.

$$V_{FB} = \frac{[R4+RS]}{R3+[R4+RS]} \times V_P \quad \text{[Eq. 1]}$$

$$RS = \begin{cases} \sum_{k=STG+1}^{N} RSk, & \text{if } STG < N \\ 0, & \text{if } STG = N \end{cases}$$

In Eq. 1, STG may indicate a count value, and the first resistance R3 may be a value preset for a target voltage. Therefore, the voltage $V_{FB}$ of the feedback node FB may increase as the stage resistance RS increases. As will be described later with reference to FIG. 15, for example, when the count value is one, the stage resistance RS may be a sum of the resistance RS1 to the resistance RSN. In another example, when the count value is two, the stage resistance RS may be a sum of the resistance RS2 to the resistance RSN. The detector 311 will be described below with reference to FIG. 8.

The second circuit 320 may receive the clock signal CLK and the pump operation signal DETECT to generate the pump clock signal CLK_PUMP. The second circuit 320 may include a NAND gate 321 and an inverter 323. The NAND gate 321 may perform the NAND operation on the clock signal CLK and the pump operation signal DETECT. The inverter 323 may invert the output of the NAND gate 321 to generate the pump clock signal CLK_PUMP.

The third circuit 330 may receive the pump operation signal DETECT to generate a delay operation signal Det_DLY. The third circuit 330 may include an even number of inverters 331, a NAND gate 333, and an inverter 335 connected to the NAND gate 333. The even number of inverters 331 may invert the pump operation signal DETECT. The number of the inverters 331 may be four, for example, but the disclosure is not limited thereto. The NAND gate 333 may perform the NAND operation on the inverted signal and the pump operation signal DETECT. The inverter 335 may generate the delay operation signal Det_DLY by inverting the output of the NAND gate 333.

The fourth circuit 340 may receive the delay signal nRST (see FIG. 5), the delay operation signal Det_DLY, and the first stage control signal EN_DYN_STG to generate the stage operation signal STAGE<N:1> of N bits. The fourth circuit 340 may include a first control circuit 350 for generating the stage enable signal nEN_STG and a second control circuit 360 for generating the stage operation signal STAGE<N:1>.

The first control circuit 350 may include transistors PT1 and NT4 gated by the delay signal nRST and a transistor NT5 gated by the delay operation signal Det_DLY. A logic level of an intermediate node A may be determined by the transistors PT1, NT4 and NT5. The logic level of the intermediate node A may be determined by inverters 351 and 352 which are connected back to back, and inverted by an inverter 353 connected to the rear end of the inverters 351 and 352 as shown in FIG. 7. A NOR gate 354 may perform the NOR operation on the inverted signal output by the inverter 353 and the first stage control signal EN_DYN_STG. An inverter 355 may generate the stage enable signal nEN_STG by inverting the output of the NOR gate 354.

The second control circuit 360 may receive the stage reference signal iSTAGE<N:1> and the stage enable signal nEN_STG to generate the stage operation signal STAGE<N:1>. The second control circuit 360 may include NOR gates 361 and inverters 362. Each NOR gate 361 may perform the NOR operation on the stage reference signal iSTAGE<N> and the stage enable signal nEN_STG. Each inverter 362 may invert the output of the corresponding NOR gate 361 to generate the stage operation signal STAGE<N>. The stage operation signal STAGE<N> may incrementally increase in accordance with an incremental increase of the stage reference signal iSTAGE<N> and in accordance with the stage enable signal nEN_STG.

Figure 8:
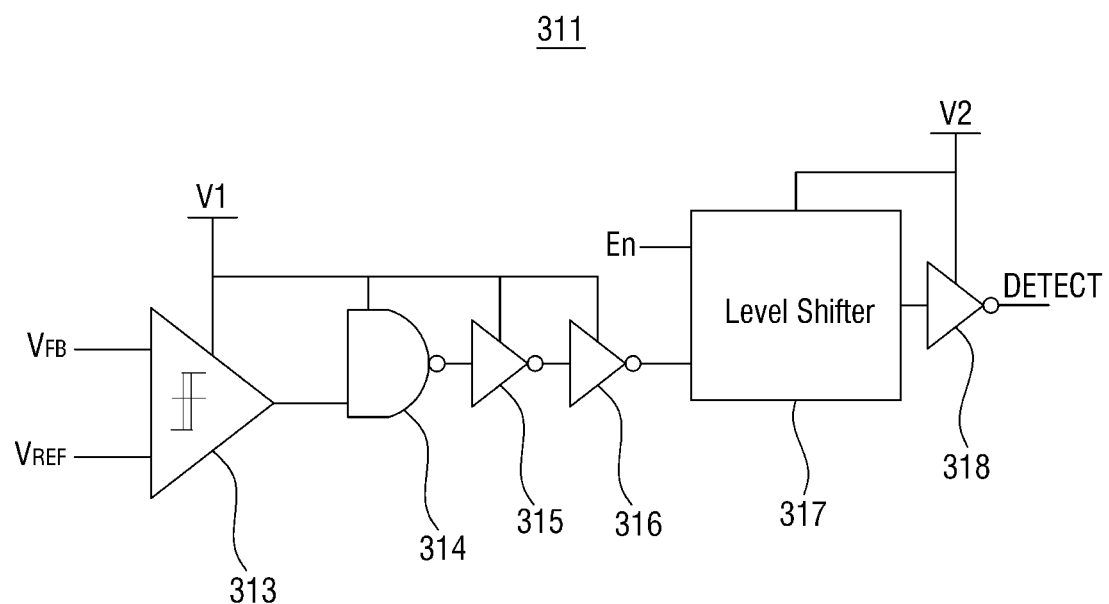
FIG. 8 is a diagram illustrating a detector of FIG. 7.

FIG. 8 is a diagram illustrating the detector of FIG. 7.

Referring to FIG. 8, the detector 311 may include a comparator 313, a NAND gate 314, inverters 315, 316 and 318, and a level shifter 317.

The comparator 313 may compare the voltage $V_{FB}$ of the feedback node with a reference voltage $V_{REF}$ to output a comparison signal. The comparison signal may be subjected to the NAND operation by the NAND gate 314 and inverted by the inverters 315 and 316. The output of the inverter 316 may be translated by the level shifter 317 enabled by the enable signal En and inverted by the inverter 318 to be output as the pump operation signal DETECT.

Figure 9:
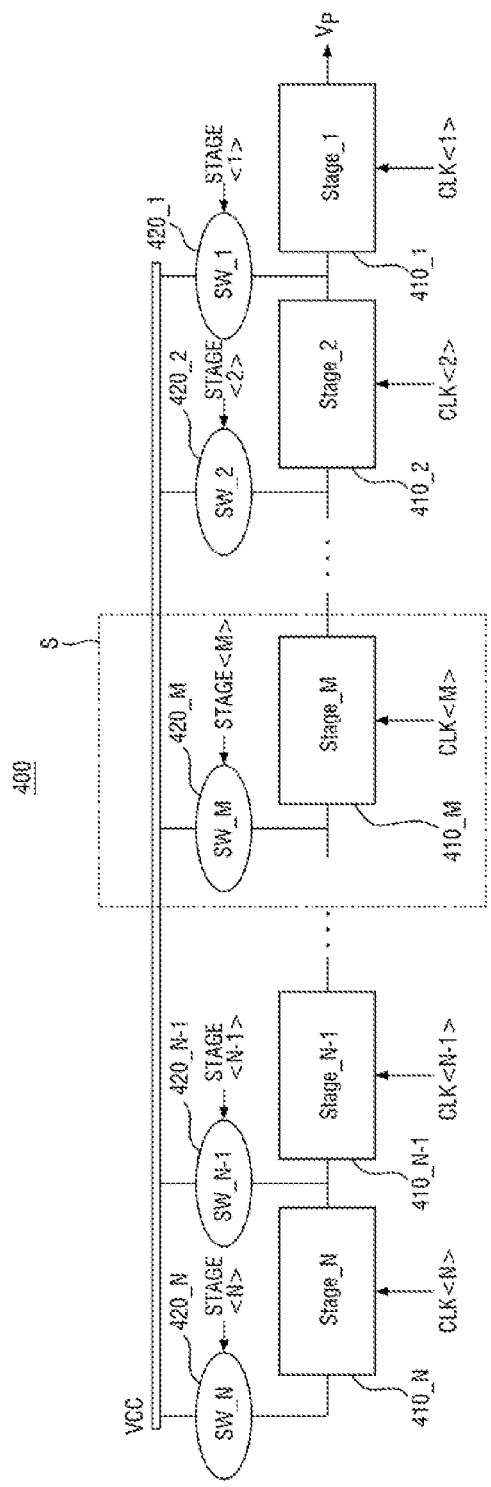
FIG. 9 is a diagram illustrating a charge pump of FIG. 4.

FIG. 9 is a diagram illustrating the charge pump of FIG. 4.

Referring to FIG. 9, the charge pump 400 may include a plurality of stages 410_1 to 410_N. The stages 410_1 to 410_N may be connected to the power supply voltage VCC through a plurality of switches 420_1 to 420_N, respectively. The switches 420_1 to 420_N may be switched on or off by the stage operation signals STAGE<1> to STAGE<N> of N bits.

The charge pump 400 may output the output voltage $V_P$ by pumping the power supply voltage VCC along the connected stages. The stages 410_1 to 410_N may be enabled by stage clock signals CLK<1> to CLK<N> of N bits. Hereinafter, a description with reference to FIG. 10 is as follows.

Figure 10:
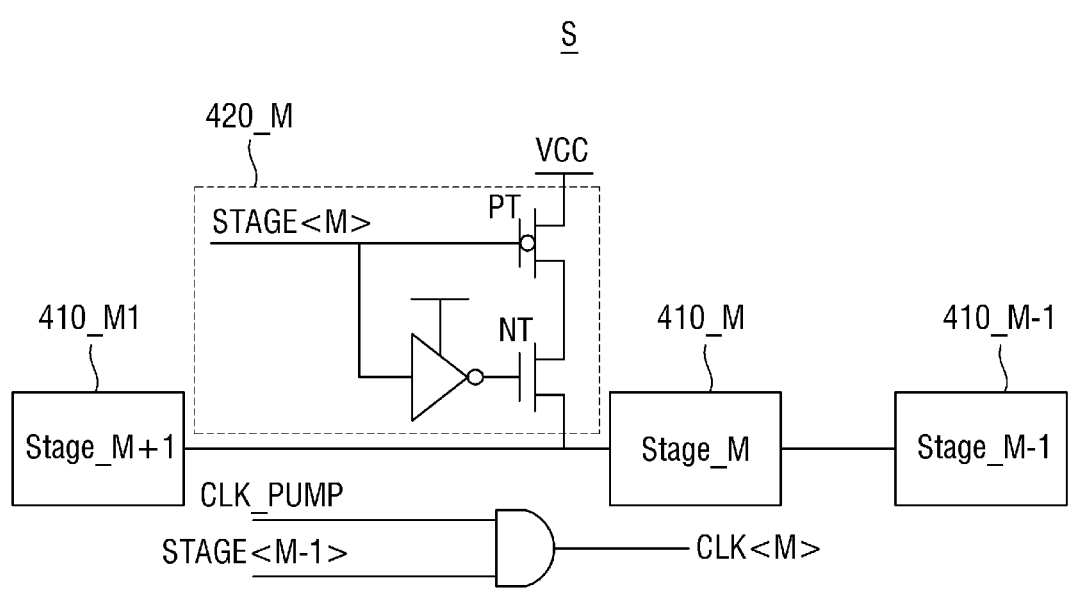
FIG. 10 is a diagram illustrating stages of FIG. 9.

FIG. 10 is a diagram explaining the stages of FIG. 9, illustrating a portion indicated by S of FIG. 9.

Referring to FIG. 10, the stage 410_M may be enabled by the stage clock signal CLK<M> which is generated in the charge pump 400 by performing the AND operation on the pump clock signal CLK_PUMP and the stage operation signal STAGE<M−1>. Therefore, the stage 410_M may be enabled when the stage operation signal STAGE<M−1> is at a first logic level.

The switch 420_M may include a first transistor PT gated by the stage operation signal STAGE<M> and a second transistor NT gated by an inverted signal of the stage operation signal STAGE<M>. For example, the first transistor PT may be a PMOS field-effect transistor, and the second transistor NT may be an NMOS field-effect transistor. Therefore, when the stage operation signal STAGE<M> is at the second logic level, the first transistor PT and the second transistor NT may be turned on, and the power supply voltage VCC may be connected to the stage 410_M. That is, the switch 420_M may be switched on. The stage 410_M may transmit the pumped power supply voltage VCC to the next stage 410_M+1.

Figure 11:
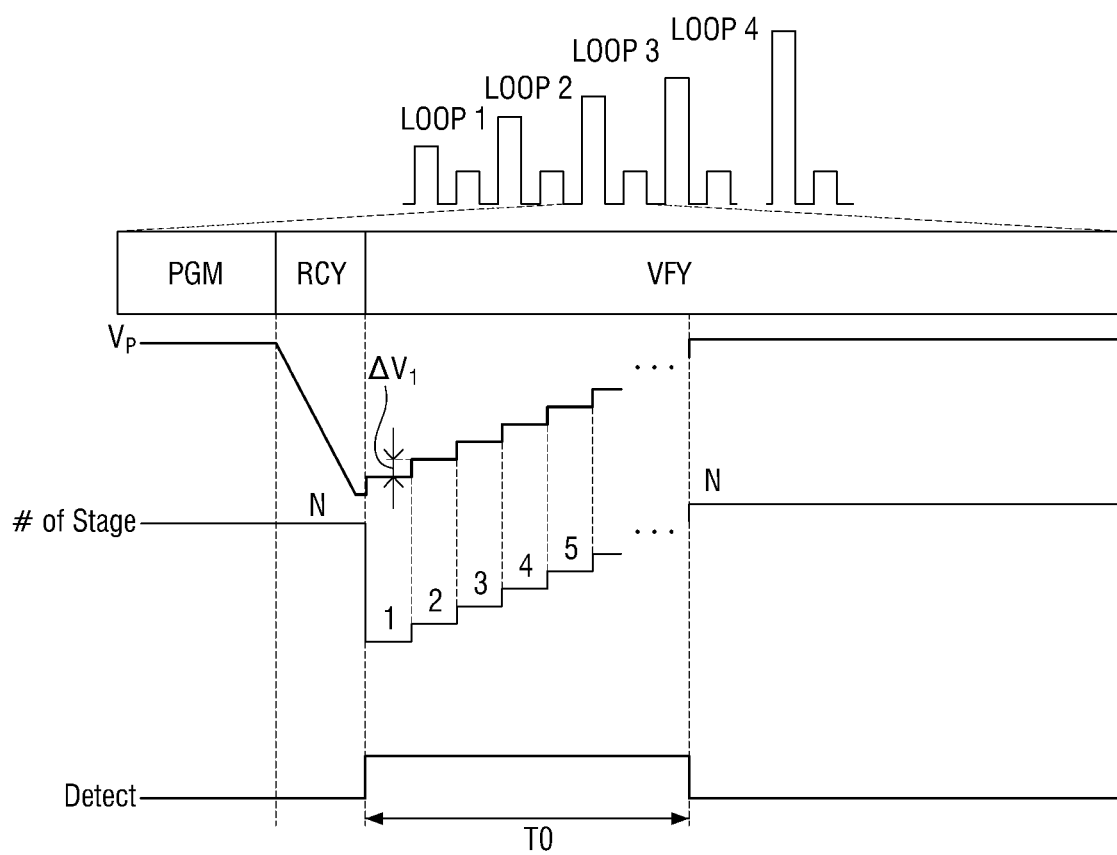
FIG. 11 is a diagram explaining an operation of the memory device according to an embodiment.
Figure 12:
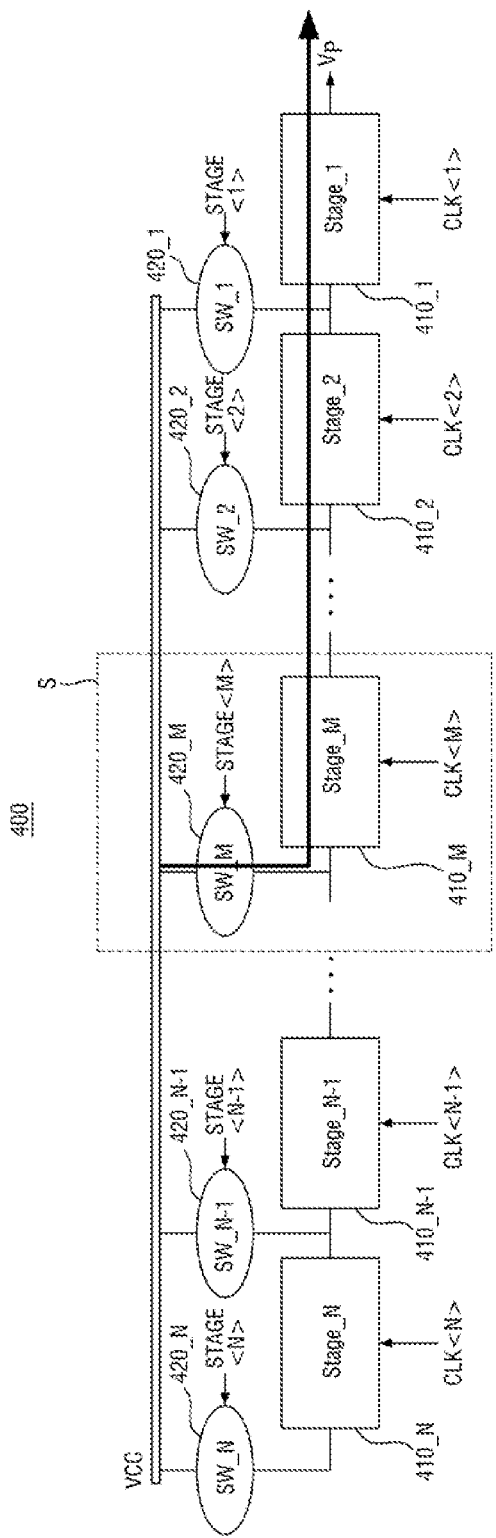
FIG. 12 is a diagram explaining an operation of the charge pump according to an embodiment.

FIG. 11 is a diagram explaining an operation of the memory device according to an embodiment. FIG. 12 is a diagram explaining an operation of the charge pump according to an embodiment.

Referring to FIG. 11, in the memory device according to an embodiment, target memory cells may be selected through a plurality of program loops LOOP 1 to LOOP N to be programmed. One loop (e.g., LOOP 3 as shown in FIG. 11) may include a program operation (PGM), a recovery operation (RCY), and a verify operation (VFY).

The memory device may be programmed in an incremental step pulse programming (ISPP) scheme to accurately control the threshold voltage distribution of the memory cells. In the program operation PGM and the verify operation VFY, a program voltage and a verify voltage may be applied to a selected word line according to the ISPP scheme, respectively.

The recovery operation RCY may be performed between the program operation PGM and the verify operation VFY. The recovery operation RCY may discharge the voltage applied to the word line after programming the selected memory cells. That is, the recovery operation RCY may cause the memory device to be ready so that the memory device may perform another operation.

Further, referring to FIGS. 9 and 11, after the voltage applied to the word line during the program operation PGM is completely discharged, the charge pump 400 may generate the verify voltage by using the power supply voltage VCC in the verify operation VFY. The charge pump 400 may output the output voltage $V_P$ by using the number of stages 410 corresponding to a count value N (shown in FIG. 11 as "# of Stage"). The count value may refer to the number of stages performing the pump operation, and may refer to a stage starting the pump operation among the plurality of stages. The count value may be sequentially increased from 1 to N.

FIG. 12 shows an operation of the charge pump 400 when the count value is M. Referring to FIGS. 11 and 12, when the count value is M, the charge pump 400 may operate the first stage 410_1 to the $M^{th}$ stage 410_M to output the output voltage $V_P$. That is, when the count value is one for example, the charge pump 400 may operate the first stage 410_1 to output the output voltage $V_P$. When the count value is two, the charge pump 400 may operate the first stage 410_1 and the second stage 410_2 to output the output voltage $V_P$. Therefore, the output voltage $V_P$ may increase by a predetermined voltage $\Delta V_1$ as the count value N increases.

In this case, the time taken for the charge pump 400 to operate from the first stage 410_1 to the $N^{th}$ stage 410_N to output the target voltage may be a first time T0.

Figure 13:
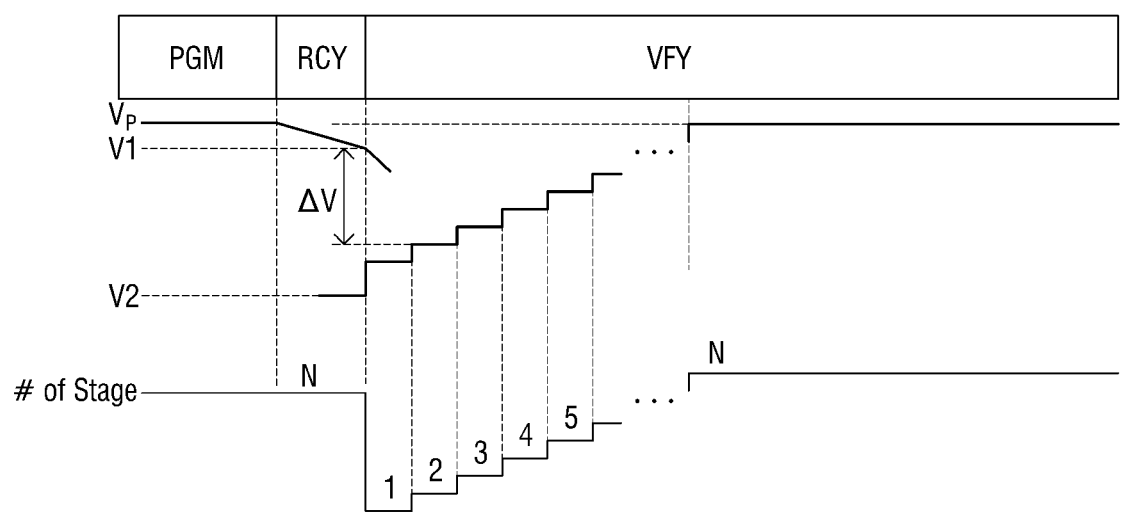
FIG. 13 is a diagram explaining an operation of the memory device according to a comparative example.

FIG. 13 is a diagram explaining an operation of the memory device according to a comparative example.

Referring to FIGS. 9 and 13, the memory device may perform the verify operation VFY during the recovery operation RCY according to a control signal. That is, the verify operation VFY may be performed while (i.e., at the same time as) the output voltage $V_P$ is discharged. At this time, in the charge pump 400, the first stage 410_1 may be operated first, of which the switch 420_1 has been switched off first after the first to $N^{th}$ switches 420_1 to 420_N are switched on to connect the power supply voltage VCC to the first to $N^{th}$ stages 420_1 to 420_N. Thus, the first stage 410_1 connected to the output end of the charge pump 400 may be applied with a first voltage V1 reduced from the output voltage $V_P$ during the recovery operation RCY and a second voltage output by the connection of the charge pump 400 to the power supply voltage VCC. Therefore, since a breakdown voltage may be applied to an element included in the first stage 410_1, the element may be damaged.

Figure 14:
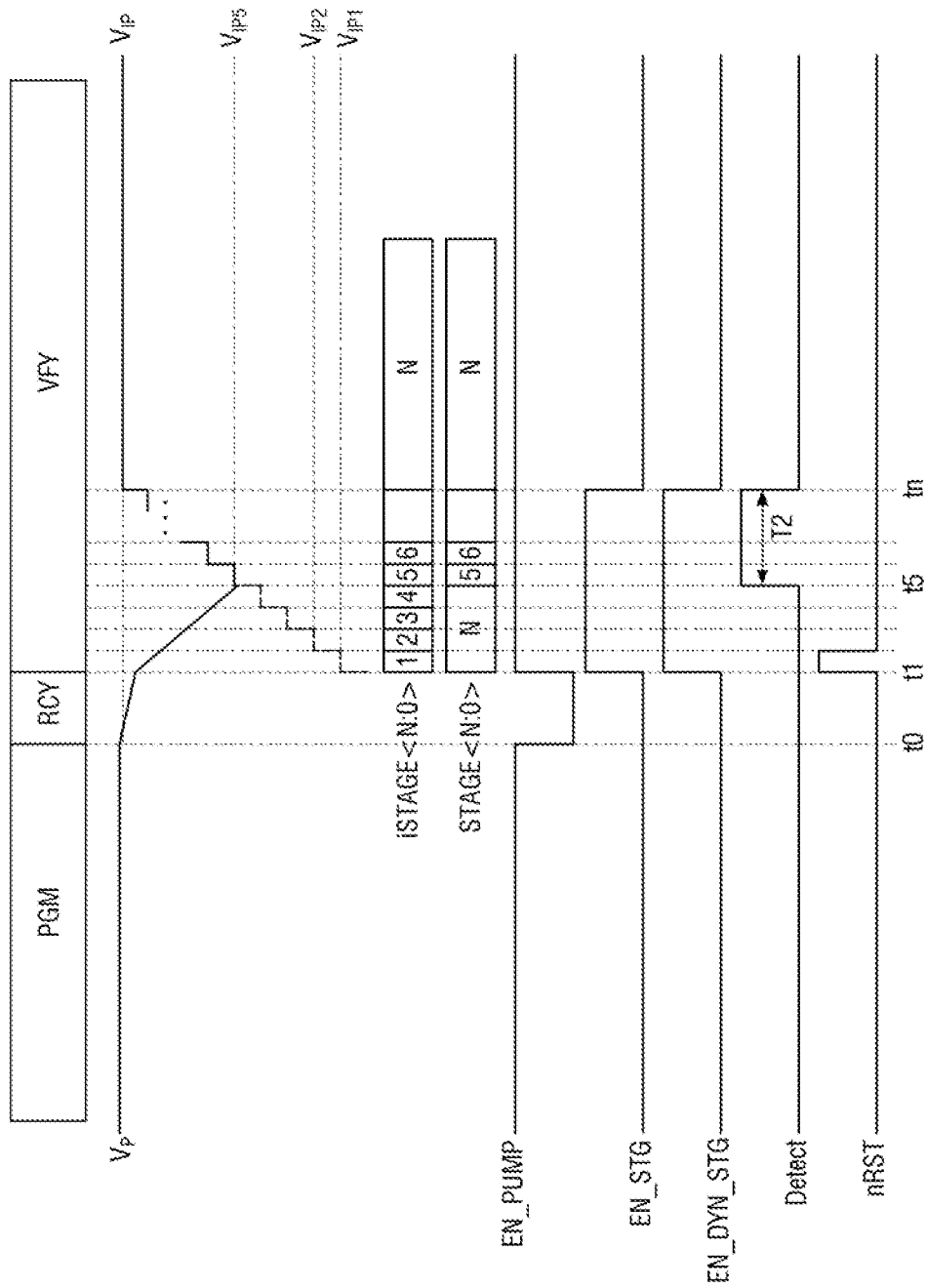
FIG. 14 is a timing diagram illustrating an operation of the memory device according to an embodiment.

FIG. 14 is a timing diagram illustrating an operation of the memory device according to an embodiment.

Referring to FIGS. 4, 5 and 14, the pump system control signal EN_PUMP may be changed from the first logic level to the second logic level at a time point t0 at which the program operation PGM is completed. At a first time point t1 at which the verify operation VFY is started, the pump system control signal EN_PUMP may be changed back to the first logic level. Accordingly, the first sub-circuit 210 may generate the delay signal nRST with a short pulse width at the second time point t2.

The second stage control signal EN_STG may be changed from the second logic level to the first logic level at the first time point t1, and changed to the second logic level at an $n^{th}$ time point tn at which the operation of the pump system 112 is completed. Accordingly, the second sub-circuit 220 may be enabled between the first time point t1 and the $n^{th}$ time point tn to generate the delay enable signal EN_ST and the intermediate signal nRST'.

The delay circuit 240 may be enabled by the delay signal nRST and the intermediate signal nRST' to output the stage reference signal iSTAGE<N:1>.

Referring to FIGS. 4, 7 to 10 and 14, the first circuit 310 may output the pump operation signal DETECT at a fifth time point t5 at which the output voltage $V_P$ of the charge pump is the same as a reference output voltage $V_{IP}$ of the charge pump, which will be described later. The first circuit 310 may output the pump operation signal DETECT until the $n^{th}$ time point tn at which the operation of the pump system 112 is completed.

The second circuit 320 may receive the pump operation signal DETECT to generate the pump clock signal CLK_PUMP enabling the stages 410. The stages 410 may be enabled by the pump clock signal CLK_PUMP. Therefore, the charge pump 400 may operate while the pump operation signal DETECT is output. That is, the charge pump 400 may operate for a second time T2 from the fifth time point t5 to the $n^{th}$ time point tn. Therefore, the memory device according to an embodiment may have a shorter operation time compared to the operation time illustrated in FIG. 11, thereby reaching the target voltage fast and reducing energy consumed by the memory device.

Meanwhile, when the verify operation VFY is performed according to the control signal during the recovery operation RCY, the operation may be performed from a specific stage included in the charge pump 400. To this end, the first stage control signal EN_DYN_STG at the first logic level may be input to the first control circuit 350. In the first control circuit 350, as the delay signal nRST is changed to the second logic level, the pump operation signal DETECT is changed to the first logic level, and as the first stage control signal EN_DYN_STG at the first logic level is input, the stage enable signal nEN_STG may be at the first logic level.

The second control circuit 360 may generate the stage operation signal STAGE<N:1> according to the stage enable signal nEN_STG. The second control circuit 360 may generate the stage operation signal STAGE<N:1> at the first logic level when the stage enable signal nEN_STG is at the first logic level. The second control circuit 360 may generate the stage operation signal STAGE<N:1> at the same level as the stage reference signal iSTAGE<N> when the stage enable signal nEN_STG is at the second logic level. That is, the second control circuit 360 may be enabled by the stage enable signal nEN_STG to generate the stage operation signal STAGE<N:1>.

For example, as illustrated in FIG. 14, when the output voltage $V_P$ of the charge pump and the reference output voltage $V_{IP5}$ of the charge pump in a case where the count value is five are the same at the fifth time point t5, the first to fourth bits of the stage operation signal STAGE<N:1> may be at the first logic level and the fifth to $N^{th}$ bits thereof may be at the same level as the stage reference signal. Accordingly, the first to fifth switches 420_1 to 420_5 may be in an off state, and the sixth to $N^{th}$ switches 420_6 to 420_N may be in an on state. The first to fifth stages 410_1 to 410_5 may therefore be in an enabled state, and the sixth to Nth stages 410_6 to 410_N may be in a disabled state. In the charge pump 400 in the example shown in FIG. 14, the sixth to $N^{th}$ stages 410_6 to 410_N may be operated according to the pump operation signal DETECT.

That is, in the charge pump 400, five stages may be operated from the fifth stage 410_5 to the first stage 410_1, and then six stages may be operated from the sixth stage 410_6 to the first stage 410_1. Subsequently, seven stages may be operated from the seventh stage 410_7 to the first stage 410_1. In such a manner, N stages may be operated from the $N^{th}$ stage 410_N to the first stage 410_1.

Figure 15:
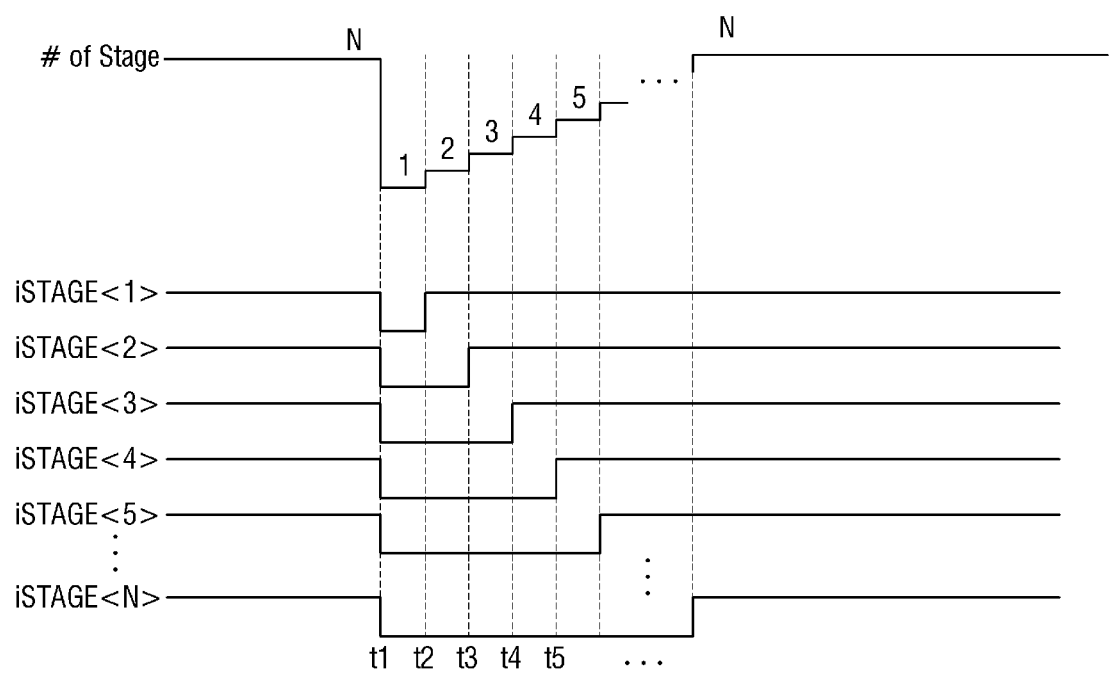
FIGS. 15 to 17 are diagrams explaining a reference output voltage of the charge pump illustrated in FIG. 14.
Figure 16:
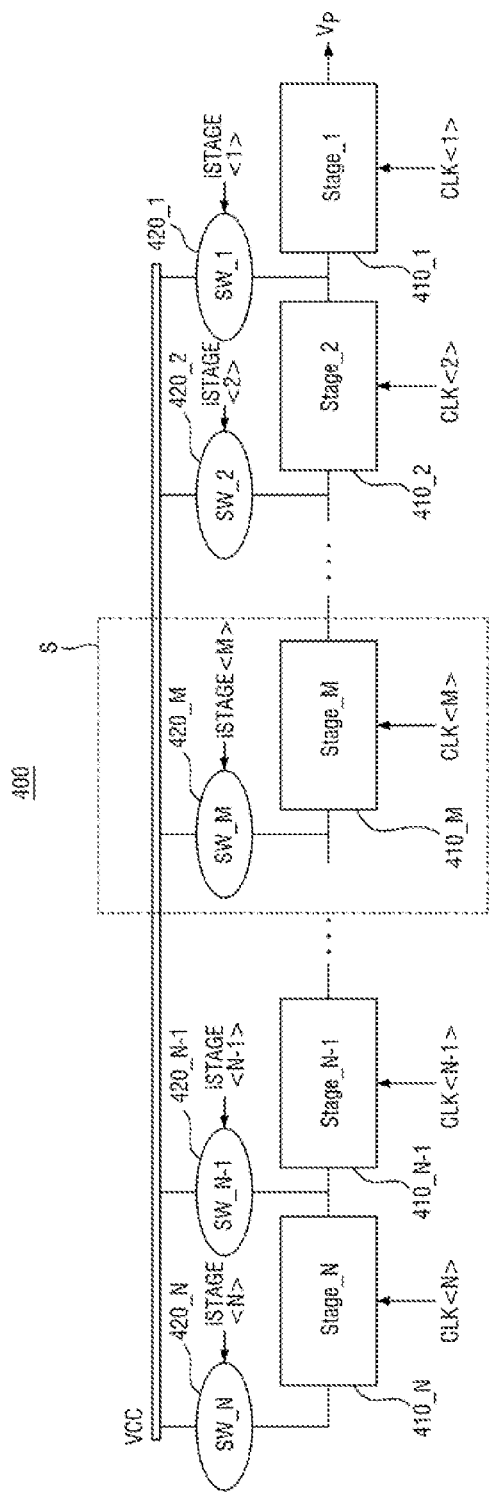
Figure 17:
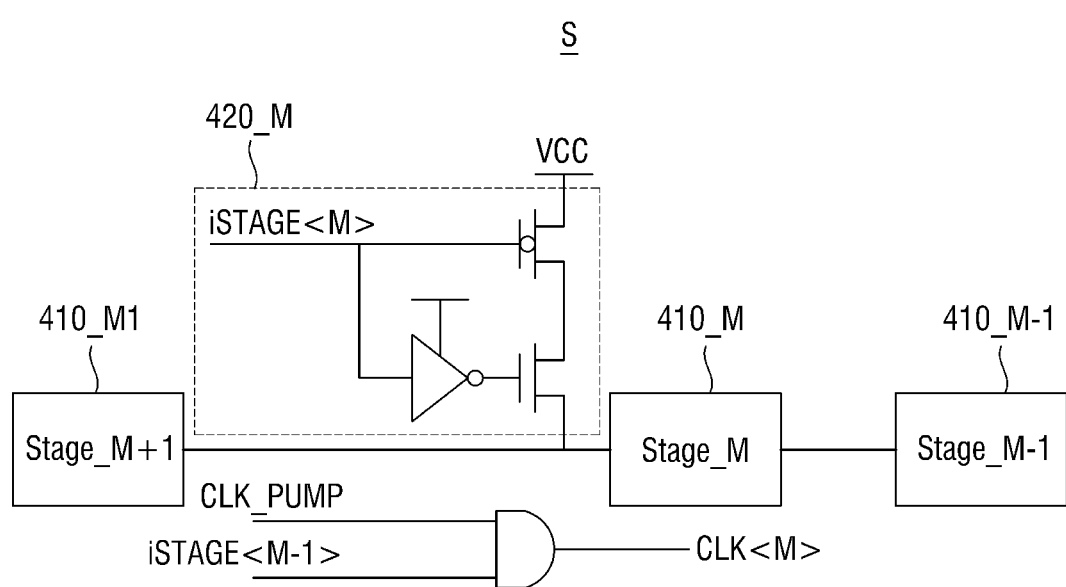

FIGS. 15 to 17 are diagrams explaining the reference output voltage of the charge pump illustrated in FIG. 14.

Referring to FIGS. 15 to 17, the stage reference signal iSTAGE<N:1> may be the N-bit signal respectively corresponding to each of the stages 410. For example, the stage reference signal iSTAGE<1> is a bit corresponding to the first stage 410_1, and the stage reference signal iSTAGE<2> is a bit corresponding to the second stage 410_2. The reference output voltage $V_{IP}$ of the charge pump may be an output voltage of the charge pump generated by using the number of stages corresponding to the count value.

All bits of the stage reference signals iSTAGE<N:1> may be changed from the first logic level to the second logic level at the first time point t1. Accordingly, the first transistor PT and the second transistor NT included in each of the switches 420_1 to 420_N may be turned on so that the switches 420_1 to 420_N may be switched on. Therefore, all of the stages 410_1 to 410_N may be connected to the power supply voltage VCC. Further, the pump clock signal CLK<1> may be changed from the second logic level to the first logic level to enable the first stage 410_1, and the pump voltage generated by the first stage 410_1 may be output. Accordingly, when the count value is 1, the reference output voltage $V_{IP}$ is generated by the first stage 410_1 and is equal to the first reference output voltage $V_{IP1}$.

At a second time point t2, the stage reference signal iSTAGE<1> may be changed from the second logic level to the first logic level. Therefore, the first transistor PT and the second transistor NT included in the first switch 420_1 may be turned off, so that the first switch 420_1 may be switched off. Accordingly, the first stage 410_1 may be disconnected from the power supply voltage VCC. Further, the pump clock signal CLK<2> may be changed from the second logic level to the first logic level to enable the second stage 410_2, so that the pump voltage generated by using the first and second stages 410_1 and 410_2 may be output. Thus, when the count value is 2, the reference output voltage $V_{IP}$ is generated by both the second stage 410_2 and the first stage 410_1 and is equal to the second reference output voltage $V_{IP2}$.

Therefore, the reference output voltage $V_{IP}$ may increase in proportion to the count value.

Figure 18:
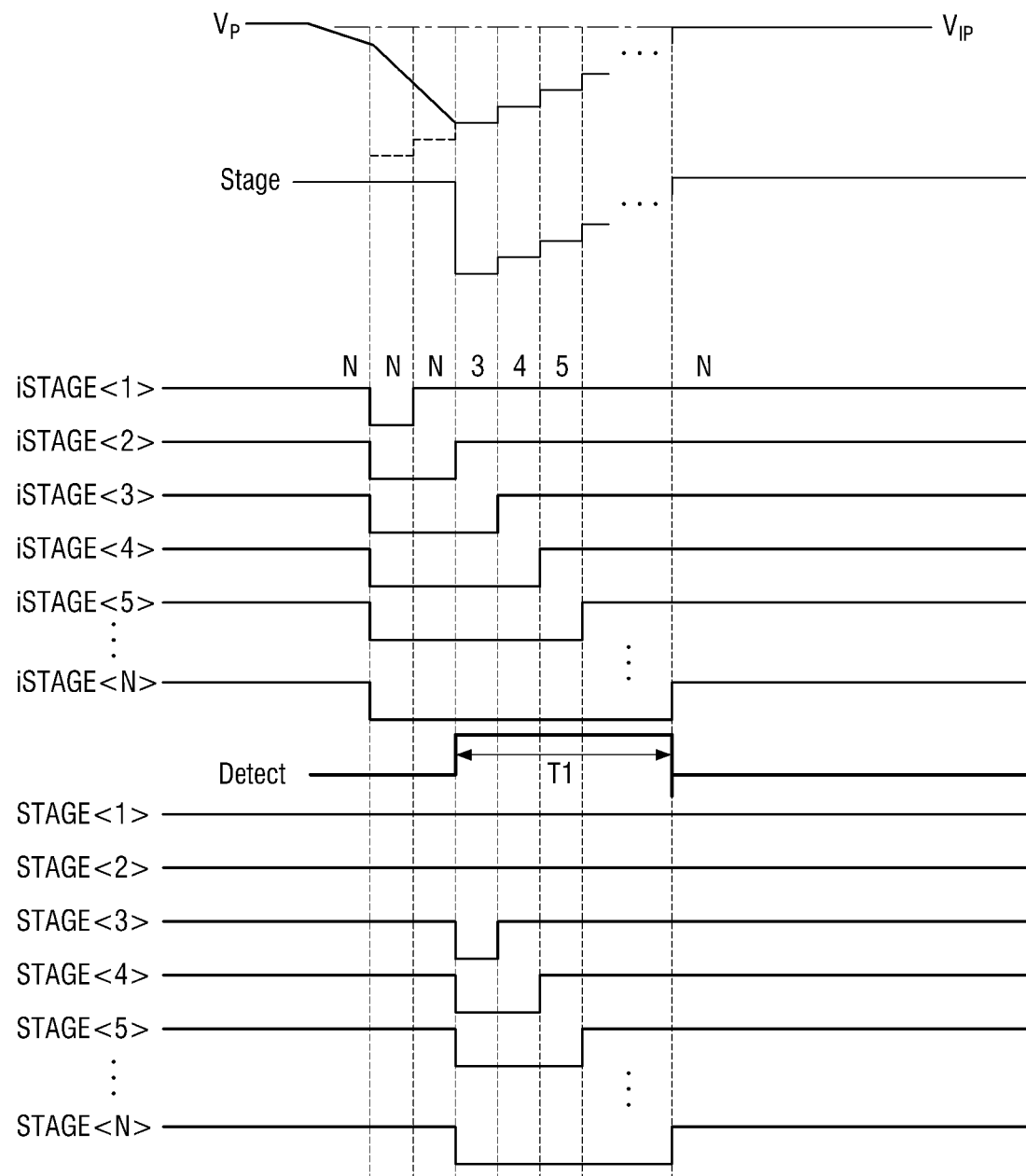
FIGS. 18 and 19 are diagrams explaining an operation of a memory device according to an embodiment.
Figure 19:
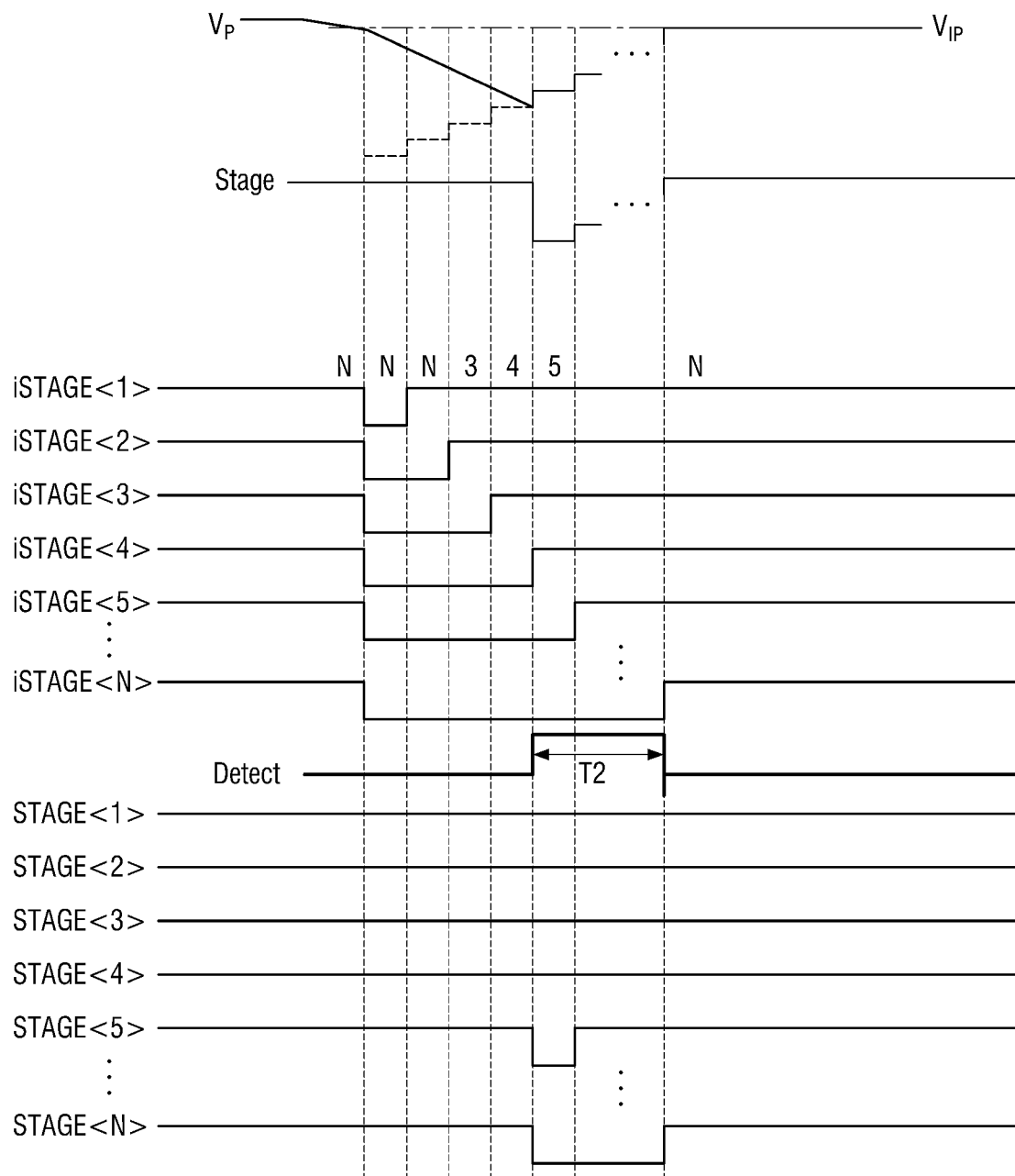

FIGS. 18 and 19 are diagrams explaining an operation of the memory device according to an embodiment.

In an example shown in FIG. 18, the output voltage $V_P$ of the charge pump is equal to the reference output voltage $V_{IP}$ of the charge pump generated by using the first to third stages. Accordingly, the first and second bits of the stage operation signal STAGE<N:1> may be at the first logic level, and the third to $N^{th}$ bits thereof may be at the same level as the stage reference signal iSTAGE<N:1>. That is, in the charge pump, the pump operation is started to perform using the first to third stage, and then the stage may be added one by one to finally perform using the first to the $N^{th}$ stage.

The pump operation signal DETECT may be output for a first time T1 from a time point at which the stage<3> is operated to a time point at which the stage<N> is operated, according to the count value. That is, the charge pump may be operated for the first time T1.

In an example shown in FIG. 19, the first to fourth bits of the stage operation signal STAGE<N:1> may be at the first logic level, and the fifth to $N^{th}$ bits thereof may be at the same level as the stage reference signal iSTAGE<N:1>. That is, in the charge pump, the pump operation is started to perform using the first to fifth stage, and then the stage may be added one by one to finally perform using the first to the $N^{th}$ stage.

The output voltage $V_P$ of the charge pump is equal to the reference output voltage $V_{IP}$ of the charge pump generated by using the first to fifth stages. The pump operation signal DETECT may be output for a second time T2 from a time point at which the stage<5> is operated to a time point at which the stage<N> is operated, according to the count value. That is, the charge pump may be operated for the second time T2.

Therefore, since the memory device according to embodiments determines the operation time of the charge pump and the stages to be operated according to the output voltage of the charge pump, the operation time of the charge pump may be reduced. In addition, energy consumed by the memory device may be reduced.

Figure 20:
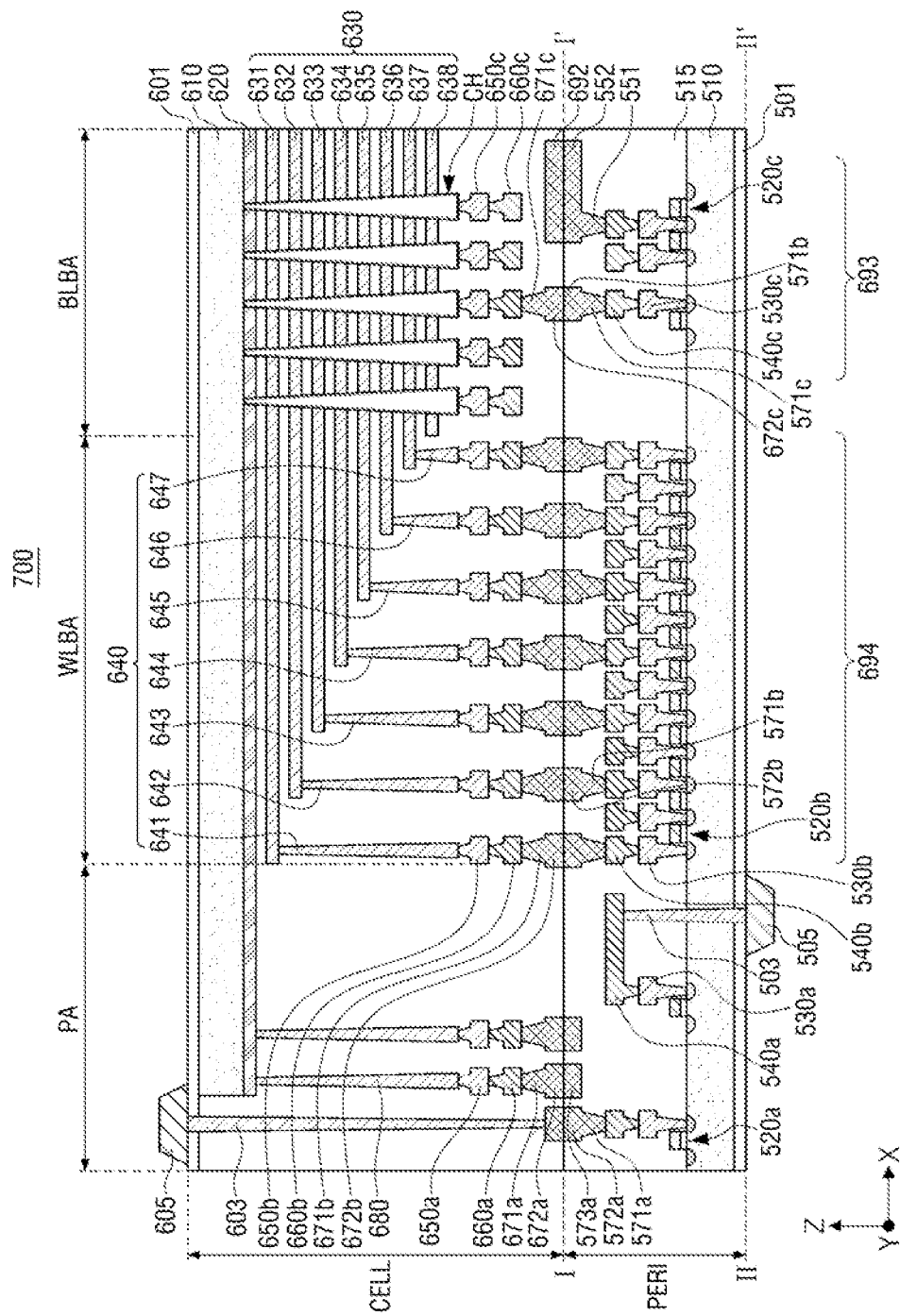
FIG. 20 is a cross-sectional view of a memory device according to an example embodiment of the disclosure.

FIG. 20 is a cross-sectional view of a memory device according to an example embodiment of the disclosure.

Referring to FIG. 20, a memory device 700 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten.

Each of the peripheral circuit region PERI and the cell region CELL of the memory device 40 may include an external pad bonding area PA, a word line bonding area WLBA, and a bit line bonding area BLBA.

The peripheral circuit region PERI may include a first substrate 510, an interlayer insulating layer 515, a plurality of circuit elements 520a, 520b, and 520c formed on the first substrate 510, first metal layers 530a, 530b, and 530c respectively connected to the plurality of circuit elements 520a, 520b, and 520c, and second metal layers 540a, 540b, and 540c formed on the first metal layers 530a, 530b, and 530c. In an example embodiment, the first metal layers 530a, 530b, and 530c may be formed of tungsten having relatively high resistance, and the second metal layers 540*a*, 540*b*, and 540*c* may be formed of copper having relatively low resistance.

In an example embodiment illustrate in FIG. 20, although the first metal layers 530*a*, 530*b*, and 530*c* and the second metal layers 540*a*, 540*b*, and 540*c* are shown and described, they are not limited thereto, and one or more metal layers may be further formed on the second metal layers 540*a*, 540*b*, and 540*c*. At least a portion of the one or more metal layers formed on the second metal layers 540*a*, 540*b*, and 540*c* may be formed of aluminum or the like having a lower resistance than those of copper forming the second metal layers 540*a*, 540*b*, and 540*c*.

The interlayer insulating layer 615 may be disposed on the first substrate 510 and cover the plurality of circuit elements 520*a*, 520*b*, and 520*c*, the first metal layers 530*a*, 530*b*, and 530*c*, and the second metal layers 540*a*, 540*b*, and 540*c*. The interlayer insulating layer 515 may include an insulating material such as silicon oxide, silicon nitride, or the like.

Lower bonding metals 571*b* and 572*b* may be formed on the second metal layer 240*b* in the word line bonding area WLBA. In the word line bonding area WLBA, the lower bonding metals 571*b* and 572*b* in the peripheral circuit region PERI may be electrically connected to upper bonding metals 671*b* and 672*b* in the cell region CELL in a bonding manner, and the lower bonding metals 571*b* and 572*b* and the upper bonding metals 671*b* and 672*b* may be formed of aluminum, copper, tungsten, or the like.

The cell region CELL may include at least one memory block. The cell region CELL may include a second substrate 610 and a common source line 620. On the second substrate 610, a plurality of word lines 631 to 638 (i.e., 630) may be stacked in a direction (a Z-axis direction), perpendicular to an upper surface of the second substrate 610. At least one string select line and at least one ground select line may be arranged on and below the plurality of word lines 630, respectively, and the plurality of word lines 630 may be disposed between the at least one string select line and the at least one ground select line.

In the bit line bonding area BLBA, a channel structure CH may extend in a direction, perpendicular to the upper surface of the second substrate 610, and pass through the plurality of word lines 630, the at least one string select line, and the at least one ground select line. The channel structure CH may include a data storage layer, a channel layer, a buried insulating layer, and the like, and the channel layer may be electrically connected to a first metal layer 650*c* and a second metal layer 660*c*. For example, the first metal layer 650*c* may be a bit line contact, and the second metal layer 660*c* may be a bit line. In an example embodiment, the bit line 660*c* may extend in a first direction (a Y-axis direction), parallel to the upper surface of the second substrate 610.

In an example embodiment illustrated in FIG. 20, an area in which the channel structure CH, the bit line 660*c*, and the like are disposed may be defined as the bit line bonding area BLBA. In the bit line bonding area BLBA, the bit line 660*c* may be electrically connected to the circuit elements 520*c* providing a page buffer 693 in the peripheral circuit region PERI. For example, the bit line 660*c* may be connected to upper bonding metals 671*c* and 672*c* in the cell region CELL, and the upper bonding metals 671*c* and 672*c* may be connected to lower bonding metals 571*c* and 572*c* connected to the circuit elements 220*c* of the page buffer 693.

In the word line bonding area WLBA, the plurality of word lines 630 may extend in a second direction (an X-axis direction), parallel to the upper surface of the second substrate 610, and may be connected to a plurality of cell contact plugs 641 to 647 (i.e., 640). The plurality of word lines 630 and the plurality of cell contact plugs 640 may be connected to each other in pads provided by at least a portion of the plurality of word lines 630 extending in different lengths in the second direction. A first metal layer 650*b* and a second metal layer 660*b* may be connected to an upper portion of the plurality of cell contact plugs 640 connected to the plurality of word lines 630, sequentially. The plurality of cell contact plugs 640 may be connected to the circuit region PERI by the upper bonding metals 671*b* and 672*b* of the cell region CELL and the lower bonding metals 571*b* and 572*b* of the peripheral circuit region PERI in the word line bonding area WLBA.

The plurality of cell contact plugs 640 may be electrically connected to the circuit elements 520*b* providing a row decoder 694 in the peripheral circuit region PERI. In an example embodiment, operating voltages of the circuit elements 520*b* providing the row decoder 694 may be different than operating voltages of the circuit elements 520*c* providing the page buffer 693. For example, operating voltages of the circuit elements 520*c* providing the page buffer 693 may be greater than operating voltages of the circuit elements 520*b* providing the row decoder 694.

A common source line contact plug 680 may be disposed in the external pad bonding area PA. The common source line contact plug 680 may be formed of a conductive material such as a metal, a metal compound, polysilicon, or the like, and may be electrically connected to the common source line 620. A first metal layer 650*a* and a second metal layer 660*a* may be stacked on an upper portion of the common source line contact plug 680, sequentially. For example, an area in which the common source line contact plug 680, the first metal layer 650*a*, and the second metal layer 660*a* are disposed may be defined as the external pad bonding area PA.

Input-output pads 505 and 605 may be disposed in the external pad bonding area PA. Referring to FIG. 20, a lower insulating film 501 covering a lower surface of the first substrate 510 may be formed below the first substrate 510, and a first input-output pad 505 may be formed on the lower insulating film 501. The first input-output pad 505 may be connected to at least one of the plurality of circuit elements 520*a*, 520*b*, and 520*c* disposed in the peripheral circuit region PERI through a first input-output contact plug 503, and may be separated from the first substrate 510 by the lower insulating film 501. In addition, a side insulating film may be disposed between the first input-output contact plug 503 and the first substrate 510 to electrically separate the first input-output contact plug 503 and the first substrate 510.

Referring to FIG. 20, an upper insulating film 601 covering the upper surface of the second substrate 610 may be formed on the second substrate 610, and a second input-output pad 605 may be disposed on the upper insulating layer 601. The second input-output pad 605 may be connected to at least one of the plurality of circuit elements 520*a*, 520*b*, and 520*c* disposed in the peripheral circuit region PERI through a second input-output contact plug 603.

According to embodiments, the second substrate 610 and the common source line 620 may not be disposed in an area in which the second input-output contact plug 603 is disposed. Also, the second input-output pad 605 may not overlap the word lines 630 in the third direction (the Z-axis direction). Referring to FIG. 20, the second input-output contact plug 603 may be separated from the second substrate 610 in a direction, parallel to the upper surface of the second substrate 610, and may pass through the interlayer insulating layer 615 of the cell region CELL to be connected to the second input-output pad 605.

According to embodiments, the first input-output pad 505 and the second input-output pad 605 may be selectively formed. For example, the memory device 700 may include only the first input-output pad 505 disposed on the first substrate 510 or the second input-output pad 605 disposed on the second substrate 610. Alternatively, the memory device 700 may include both the first input-output pad 505 and the second input-output pad 605.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 700 may include a lower metal pattern 573a, corresponding to an upper metal pattern 672a formed in an uppermost metal layer of the cell region CELL, and having the same shape as the upper metal pattern 672a of the cell region CELL, in an uppermost metal layer of the peripheral circuit region PERI. In the peripheral circuit region PERI, the lower metal pattern 573a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 571b and 572b may be formed on the second metal layer 240b in the word line bonding area WLBA. In the word line bonding area WLBA, the lower bonding metals 571b and 572b of the peripheral circuit region PERI may be electrically connected to the upper bonding metals 671b and 672b of the cell region CELL by a Cu—Cu bonding.

Further, the bit line bonding area BLBA, an upper metal pattern 692, corresponding to a lower metal pattern 552 formed in the uppermost metal layer of the peripheral circuit region PERI, and having the same shape as the lower metal pattern 552 of the peripheral circuit region PERI, may be formed in an uppermost metal layer of the cell region CELL. A contact may not be formed on the upper metal pattern 692 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

In concluding the detailed description, those skilled in the art will appreciate that many variations and modifications can be made to the preferred embodiments without substantially departing from the principles of the disclosure. Therefore, the disclosed preferred embodiments of the disclosure are used in a generic and descriptive sense only and not for purposes of limitation.

What is claimed is:

1. A memory device comprising:
    a memory cell region including a first metal pad;
    a peripheral circuit region including a second metal pad and vertically connected to the memory cell region by the first metal pad and the second metal pad;
    a charge pump comprising a plurality of stages to output an output voltage in the peripheral circuit region;
    a stage counter in the peripheral circuit region configured to output a count value that incrementally increases to a number of the plurality of stages; and
    a regulator in the peripheral circuit region configured to output a pump operation signal by comparing the output voltage with a reference output voltage of the charge pump, the reference output voltage being generated using the incrementally increasing count value obtained by the stage counter,
    wherein the charge pump is configured to operate in response to the pump operation signal.

2. The memory device of claim 1, wherein the charge pump is configured to output the output voltage equal to the reference output voltage when the pump operation signal is output.

3. The memory device of claim 1, wherein the stage counter comprises a delay circuit configured to output a stage reference signal having a number of bits corresponding to the number of the plurality of stages, and
    wherein the count value is obtained according to a number of bits included in the stage reference signal having a first logic level.

4. The memory device of claim 3, wherein the regulator is configured to generate a stage operation signal based on the stage reference signal and the pump operation signal, and
    wherein each stage from among the plurality of stages of the charge pump is configured to operate in response to the stage operation signal.

5. The memory device of claim 4, further comprising:
    a plurality of switches in the peripheral circuit region respectively connecting a power supply voltage to the plurality of stages,
    wherein the plurality of switches is configured to operate in accordance with the stage operation signal.

6. The memory device of claim 4, wherein the regulator is configured to generate a pump clock signal based on a clock signal and the pump operation signal, and
    wherein the charge pump is configured to generate a stage clock signal based on the pump clock signal and the stage operation signal to enable the plurality of stages of the charge pump.

7. The memory device of claim 1, wherein the charge pump is configured to operate from a stage corresponding to the obtained count value at a time when the reference output voltage becomes greater than or equal to the output voltage, and
    wherein the output voltage of the charge pump is set to equal the reference output voltage from the time when the reference output voltage becomes greater than or equal to the output voltage.

8. The memory device of claim 1, wherein the regulator is configured to output the pump operation signal by comparing the output voltage with the reference output voltage while the output voltage of the charge pump decreases to a ground voltage.

9. A memory device comprising:
a memory cell region including a first metal pad;
a peripheral circuit region including a second metal pad and vertically connected to the memory cell region by the first metal pad and the second metal pad;
a charge pump comprising a plurality of stages in the peripheral circuit region;
a stage counter in the peripheral circuit region configured to output a respective stage reference signal corresponding to each stage from among the plurality of stages; and
a regulator in the peripheral circuit region configured to generate a stage operation signal different from the stage reference signal based on the stage reference signal and a first stage control signal,
wherein the charge pump is configured to generate an output voltage using a number of stages corresponding to the stage reference signal or the stage operation signal output by the regulator.

10. The memory device of claim 9, wherein the regulator comprises a detector configured to set a pump operation signal to a first logic level when the output voltage of the charge pump is equal to or greater than a reference output voltage of the charge pump, the reference output voltage being generated using the number of stages, and
wherein the charge pump is configured to generate the output voltage in response to the pump operation signal.

11. The memory device of claim 10, wherein the stage operation signal is equal to the stage reference signal from a time point at which the pump operation signal is output.

12. The memory device of claim 10, wherein the detector is configured to compare a reference voltage with a feedback voltage of a feedback node, the feedback voltage being based on the output voltage and a stage resistance of a stage resistor connected to the feedback node, to output the pump operation signal, and
wherein the stage resistance is determined based on the stage reference signal.

13. The memory device of claim 9, wherein the stage counter comprises:
a first sub-circuit configured to generate a delay signal based on a pump system control signal and an inverted pump system control signal;
a second sub-circuit configured to generate a delay enable signal based on the pump system control signal and a second stage control signal; and
a delay circuit configured to receive the delay signal and the delay enable signal and generate the stage reference signal based on the delay signal and the delay enable signal.

14. The memory device of claim 13, wherein the first stage control signal is output at a same time point as the second stage control signal.

15. The memory device of claim 13, wherein the pump system control signal and the second stage control signal are output at a same time point.

16. The memory device of claim 13, wherein the regulator comprises:
a first circuit configured to output a pump operation signal;
a second circuit configured to generate a delay operation signal based on the pump operation signal; and
a third circuit configured to generate a stage enable signal by performing a NAND operation and an inversion operation on the first stage control signal and a signal obtained based on the delay signal and the delay operation signal,
wherein the charge pump is configured to generate the output voltage in response to the pump operation signal, and
wherein the regulator is configured to output the stage operation signal based on the stage enable signal and the stage reference signal.

17. A memory device comprising:
a memory cell region including a first metal pad;
a peripheral circuit region including a second metal pad and vertically connected to the memory cell region by the first metal pad and the second metal pad;
a memory cell array in the memory cell region comprising a plurality of memory cells; and
a voltage generator in the peripheral circuit region configured to generate a program voltage of a memory cell in the memory cell array,
wherein the voltage generator comprises:
a charge pump configured to generate the program voltage, and
a regulator configured to generate a pump operation signal by comparing a reference output voltage of the charge pump, generated using at least one of a plurality of stages, with an output voltage of the charge pump as it recovers from the program voltage to a ground voltage after the charge pump generates the program voltage, and
wherein the charge pump is configured to operate in response to the pump operation signal.

18. The memory device of claim 17, further comprising:
a control logic in the peripheral circuit region configured to output a control signal for enabling a verify operation for the memory cell in a recovery operation after the voltage generator generates the program voltage of the memory cell.

19. The memory device of claim 18, wherein the voltage generator is configured to generate the pump operation signal in response to the control signal.

20. The memory device of claim 17, wherein the regulator is configured to output a stage operation signal for enabling an operation of the charge pump when the output voltage of the charge pump is greater than or equal to the reference output voltage of the charge pump.

* * * * *